US010547160B2

(12) United States Patent
Santis et al.

(10) Patent No.: US 10,547,160 B2
(45) Date of Patent: Jan. 28, 2020

(54) GUIDING AND CONFINING OF ELECTROMAGNETIC MODES IN LOW-INDEX MATERIALS

(71) Applicant: CALIFORNIA INSTITUTE OF TECHNOLOGY, Pasadena, CA (US)

(72) Inventors: Christos T. Santis, Santa Barbara, CA (US); Amnon Yariv, Pasadena, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 0 days.

(21) Appl. No.: 16/226,449

(22) Filed: Dec. 19, 2018

(65) Prior Publication Data

US 2019/0214789 A1 Jul. 11, 2019

Related U.S. Application Data

(60) Provisional application No. 62/738,116, filed on Sep. 28, 2018, provisional application No. 62/614,815, filed on Jan. 8, 2018.

(51) Int. Cl.
| | |
|---|---|
| *H01S 5/343* | (2006.01) |
| *H01S 5/34* | (2006.01) |
| *H01S 5/30* | (2006.01) |
| *H01S 5/22* | (2006.01) |
| *H01S 5/042* | (2006.01) |

(Continued)

(52) U.S. Cl.
CPC ............ *H01S 5/22* (2013.01); *G02B 6/12* (2013.01); *G02F 1/35* (2013.01); *H01S 5/021* (2013.01); *H01S 5/026* (2013.01); *H01S 5/0422* (2013.01); *H01S 5/0424* (2013.01); *H01S 5/06817* (2013.01); *H01S 5/142* (2013.01); *H01S 5/3427* (2013.01); *H01S 5/34306* (2013.01); *H01S 5/34313* (2013.01); *H01S 5/34333* (2013.01); *H01S 5/0092* (2013.01); *H01S 5/0265* (2013.01); *H01S 5/02469* (2013.01); *H01S 5/04257* (2019.08); *H01S 5/106* (2013.01); *H01S 5/1032* (2013.01); *H01S 5/1039* (2013.01); *H01S 5/141* (2013.01); *H01S 5/2031* (2013.01); *H01S 5/3054* (2013.01)

(58) Field of Classification Search
CPC .. H01S 5/3427; H01S 5/0422; H01S 5/06817; H01S 5/34313; H01S 5/34333; H01S 5/3054
USPC ........................................ 372/45.01
See application file for complete search history.

(56) References Cited

U.S. PATENT DOCUMENTS

| | | | | |
|---|---|---|---|---|
| 2011/0058586 A1* | 3/2011 | Takizawa | .............. | B82Y 20/00 372/45.01 |
| 2012/0321244 A1* | 12/2012 | Suzuki | .................. | G02B 6/305 385/14 |

OTHER PUBLICATIONS

Carmon, T. et al., "Dynamical Thermal Behavior and Thermal Self-Stability of Microcavities", Optics Express, vol. 12, No. 20, pp. 4742-4750, (Oct. 2004).

(Continued)

*Primary Examiner* — Tuan N Nguyen
(74) *Attorney, Agent, or Firm* — Steinfl + Bruno LLP

(57) ABSTRACT

The optical mode of a photonic device is coupled between a first region made of a semiconducting material, and a second region made of a dielectric material. Photons are generated within the first region, while the optical mode is predominantly stored within the second region. The thickness of the first region and its width are controlled to determine its effective refractive index, enabling control of the optical mode.

26 Claims, 35 Drawing Sheets

(51) Int. Cl.

| | | |
|---|---|---|
| *H01S 5/068* | (2006.01) | |
| *G02F 1/35* | (2006.01) | |
| *G02B 6/12* | (2006.01) | |
| *H01S 5/14* | (2006.01) | |
| *H01S 5/02* | (2006.01) | |
| *H01S 5/026* | (2006.01) | |
| *H01S 5/00* | (2006.01) | |
| *H01S 5/10* | (2006.01) | |
| *H01S 5/024* | (2006.01) | |
| *H01S 5/20* | (2006.01) | |

(56) References Cited

OTHER PUBLICATIONS

Davanco, M. et al., "Heterogeneous Integration for On-Chip Quantum Photonic Circuits with Single Quantum Dot Devices", Nature Communications, vol. 8: 889, (2017). 12 pages.
Dutt, A. et al., "On-Chip Optical Squeezing", Physical Review Applied, vol. 3, No. 4, 044005-1-044005-7, (2015). 7 pages.
Fan, X. et al., "Sensitive Optical Biosensors for Unlabeled Targets: A Review", Analytica Chimica Acta, vol. 620, No. 1, pp. 8-26, (2008).
Fang, A.W. et al., "Electrically Pumped Hybrid AlGaInAs-Silicon Evanescent Laser", Optics Express, vol. 14, pp. 9203-9210, (Oct. 2, 2006).
Fujii, T. et al., "Epitaxial Growth of InP to Bury Directly Bonded Thin Active Layer on SiO2/Si Substrate for Fabricating Distributed Feedback Lasers on Silicon", IET Optoelectron, vol. 9, Issue 4, pp. 151-157, (2015).
Ikku, Y. et al., "Low-Driving-Current InGaAsP Photonic-Wire Optical Switches using III-CMOS Photonics Platform", Optics Express, vol. 20, No. 26, pp. B357-B364, (Dec. 2012). 8 pages.
Inoue, D. et al., "Submilliampere Threshold Operation of Butt-Jointed Built-In Membrane DFB Laser Bonded on Si Substrate", Optics Express, vol. 23, No. 6, pp. 7771-7778, (Mar. 2015).
Ji, X. et al., "Ultra-Low-Loss-on-Chip Resonators with Sub-Milliwatt Parametric Oscillation Threshold", Optica, vol. 4, No. 6, pp. 619-624, (Jun. 2017).
Johnson, A.R. et al., "Octave-Spanning Coherent Supercontinuum Generation in a Silicon Nitride Waveguide", Optics Letters, vol. 40, No. 21, pp. 5117-5120, (Nov. 1, 2015).
Kippenberg, T.J. et al., "Microresonator-Based Optical Frequency Combs", Science, vol. 332, No. 6029, pp. 555-559, (2011). 6 pages.
Li, J. et al., "Microwave Synthesizer using an On-Chip Brillouin Oscillator", Nature Communications, vol. 4, 7 pages, (2013).
Li, Q. et al., "Stably Accessing Octave-Spanning Microresonator Frequency Combs in the Soliton Regime", Optica, vol. 4, No. 2, pp. 193-203, (Feb. 2017).
Luke, K. et al., "Overcoming Si3N4 Film Stress Limitations for High Quality Factor Ring Resonators", Optics Express, vol. 21, No. 19, pp. 22829-22833, (2013).
Matsuo, S. et al., "Directly Modulated Buried Heterostructure DFB Laser on SiO2/Si Substrate Fabricated by Regrowth of InP using Bonded Active Layer", Optics Express, vol. 22, No. 10, pp. 12139-12147, (May 2014).
Nozaki, K. et al., "Photonic-Crystal Nano-Photodetector with Ultrasmall Capacitance for On-Chip Light-to-Voltage Conversion Without an Amplifier", Optica, vol. 3, No. 5, pp. 483-492, (May 2016).
Nozaki, K. et al., "Ultralow-Energy Electro-Absorption Modulator Consisting of InGaAsP-Embedded Photonic-Crystal Waveguide", APL Photonics, vol. 2, No. 5, 056105-1-056105-11, (2017), 12 pages.
Okawachi, Y. et al., "Octave-Spanning Frequency Comb Generation in a Silicon Nitride Chip", Optics Letters, vol. 36, No. 17, pp. 3398-3400, (2011).
Pfeiffer, M.H.P. et al., "Octave-Spanning Dissipative Kerr Soliton Frequency Combs in Si3N4 Microresonators", Optica, vol. 4, No. 7, pp. 684-691, (Jul. 2017).
Pfeiffer, M.H.P. et al., Photonic Damascene Process for Integrated High-Q Microresonator Based Nonlinear Photonics, vol. 3, No. 1, pp. 20-25, (2016).
Santis, C. et al., "High-Coherence Semiconductor Lasers Based on Integral High-Q Resonators in Hybrid Si/III-V Platforms", Proceedings of the National Academy of Sciences of the United States of America, vol. 111, No. 8, pp. 2879-2884, (2014).
Santis, C.T. et al., "High-Q Silicon Resonators for High-Coherence Hybrid Si/III-V Semiconductor Lasers", CLEO: 2015 Conference on Lasers and Electro-Optics, SW3F.6, (2015), 2 pages.
Santis, C.T. et al., "Sub-kHz Quantum Linewidth Semiconductor Laser on Silicon Chip", CLEO: 2015 Postdeadline Paper Digest, JTh5A.7, Optical Society of America, (2015), 2 pages.
Sysak, M.N. et al., "Experimental and Theoretical Thermal Analysis of a Hybrid Silicon Evanescent Laser", Optics Express, vol. 15, No. 23, pp. 15041-15046, (2007).
Takeda, K. et al., "Few-fj/bit Data Transmissions Using Directly Modulated Lambda-Scale Embedded Active Region Photonic-Crystal Lasers", Nature Photonics, vol. 7, pp. 569-575, (2013). 7 pages.
Tomiyasu, T. et al., "High-Differential Quantum Efficiency Operation of GaInAsP/InP Membrane Distributed-Reflector Laser on Si", Applied Physics Express, vol. 10, No. 6, 0627021-062702-4, (2017). 5 pages.
Vilenchik, Y. et al., "Theory and Observation on Non-Linear Effects Limiting the Coherence Properties of High-Q Hybrid Si/III-V Lasers", Novel in-Plane Semiconductor Lasers XIV, vol. 9382, (2015) . 9 pages.
Xuan, Y. et al., "High-Q Silicon Nitride Microresonators Exhibiting Low-Power Frequency Comb Initiation", Optica, vol. 3, No. 11, pp. 1171-1180, (Nov. 2016).
Yokoyama, M. et al., "Ultrathin Body InGaAs-on-Insulator Metal-Oxide-Semiconductor Field-effect Transistors with InP Passivation Layers on Si Substrates Fabricated by Direct Wafer Bonding", Applied Physics Express, vol. 4, No. 5, 054202-1-054202-3, (2011). 4 pages.
Bovington, J.T., et al., "Heterogeneous Lasers and Coupling to Si3N4 near 1060 nm," Optics Letters vol. 39, No. 20, pp. 6017-6020. 2014.
C. H. Henry, "Theory of the linewidth of semiconductor lasers," IEEE Journal of Quantum Electronics, vol. 18, No. 2, pp. 259-264, Feb. 1982. 6 Pages.
Carlson, D.R., et al., "Photonic-Chip Supercontinuurn with tailored Spectra for Precision Frequency Metrology," Phys. Rev. Applied, vol. 8, p. 014027, Feb. 13, 2017. 10 Pages.
Fujii, T., et al., "Evaluation of device parameters for membrane lasers on Si fabricated with active-layer bonding followed by epitaxial growth," IEICE Transactions on Electronics, vol. E100.C, No. 2, pp. 196-203. Feb. 2017. 8 Pages.
Hiratani, T., et al., "Thermal properties of lateral-current-injection semiconductor membrane Fabry-Perot laser under continuous-wave operation," Japanese Journal of Applied Physics, vol. 54, No. 4, 2015. 6 Pages.
Joyce, W.B., "Thermal resistance of heterostructure lasers," Journal of Applied Physics, vol. 46, No. 2, pp. 855-862, 1975. 9 Pages.
Leuthold, C., et al., "Nonlinear Silicon Photonics," Nature Photonics, vol. 4, pp. 535-544, Aug. 2010, 10 Pages.
Levy., J.S., et al., CMOS-Compatible Multiple-wavelength Oscillator for on-chip Optical Interconnects, Nature Photonics, vol. 4, No. 1, pp. 37-40, Jan. 2010, 4 Pages.
Li, Q., et al., "Efficient and Low-Noise single-photon-level Frequency Conversion Interfaces Using Silicon Nanophotonics," Nature Photonics, vol. 10, No. 6, pp. 406-414, Jun. 2016. 10 Pages.
Liao, P., et al., "Dependence of a Microresonator Kerr Frequency Comb on the Pump Linewidth," Opt. Lett, vol. 42, No. 4., pp. 779-782, Feb. 10, 2017. 4 Pages.
Marin-Palomo, P., et al., "Microresonator-based Solitons for Massively Parallel Coherent Optical Communications," Nature, vol. 546, pp. 274-279, Jun. 8, 2017. 8 Pages.
Matsuo, S., et al., "Ultralow Operating Energy Electrically Driven Photonic Crystal Lasers," IEEE Journal of Selected Topics in Quantum Electronics, vol. 19, No. 4, Jul./Aug. 2013. 11 Pages.

(56) References Cited

OTHER PUBLICATIONS

Moss, D.J., et al., "New CMOS-Compatible Platforms Based on Silicon Nitride and Hydex for Nonlinear Optics," Nature Photonics, vol. 7, No. 8, pp. 597-607, Jul. 30, 2013. 11 Pages.
Namizaki, H., et al., "Transverse-Junction-Stripe Lasers with a GaAS p-n Homojunction," IEEE Journal of Quantum Electronics, vol. QE11, No. 7, pp. 427-431, Jul. 1975. 5 Pages.
Namizaki, H., et al., "Transverse-Junction-Stripe-Geometry Double-Heterostructure Lasers with Very Low Threshold Current," Journal of Applied Physics, vol. 45, No. 6, pp. 2785-2786, 1974. 3 Pages.
Pfeifle, J., et al., "Coherent Terabit Communications with Microresonator Kerr Frequency Combs," Nature Photonics, vol. 8, No. 5, pp. 375-380, May 1, 2014. 13 Pages.
Shindo., T., et al., "Design of Lateral-Current-Injection-Type Membrane Distributed-Feedback Lasers for On-Chip Optical Interconnections," IEEE Journal of Selected Topics in Quantum Electronics, vol. 19, No. 4, Jul./Aug. 2013. 9 Pages.
Sun, X., et al., "Adiabaticity Criterion and the Shortest Adiabatic Mode Transformer in a Coupled-Waveguide System," Optics Letters vol. 34, No. 3, pp. 280-2. 2009.
Yokoyama, M., et al., "Formation of III-V-on-Insulator Structures on Si by Direct Wafer Bonding," Semiconductor Science and Technology, vol. 28, No. 9, p. 094009, 2013. 11 Pages.

\* cited by examiner

GUIDING AND CONFINING OF ELECTROMAGNETIC MODES IN LOW-INDEX MATERIALS

CROSS REFERENCE TO RELATED APPLICATIONS

The present application claims priority to U.S. Provisional Patent Application No. 62/614,815, filed on Jan. 8, 2018, and U.S. Provisional Patent Application No. 62/738,116, filed on Sep. 28, 2018, the disclosures of both being incorporated herein by reference in their entirety.

TECHNICAL FIELD

The present disclosure relates to optical devices. More particularly, it relates to guiding and confining of electromagnetic modes in low-index materials.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

SUMMARY

Figure 1:
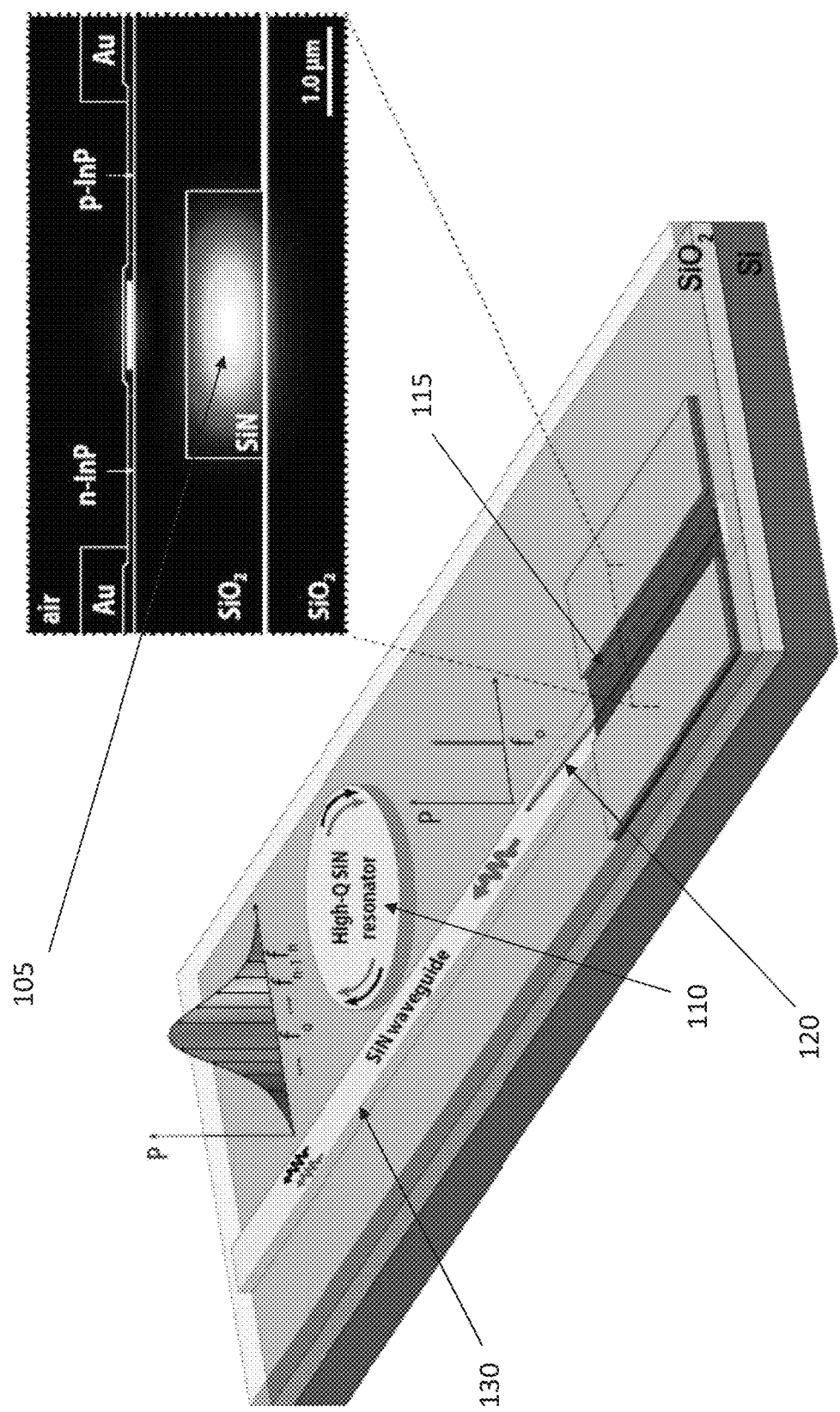
FIG. 1 illustrates an example of an on-chip powered, optical parametric oscillator.

In a first aspect of the disclosure, a device is described, the device comprising: a first region having a first bulk refractive index, the first region made of a semiconducting material; and a second region having a second bulk refractive index, the second region made of a dielectric material and configured to confine an optical mode during operation of the device, wherein: during operation, the optical mode is at least 80% confined within the second region, the first bulk refractive index is higher than the second bulk refractive index, a first effective refractive index of the first region for the optical mode is lower than the first bulk refractive index, and the first effective refractive index is equal to or lower than a second effective refractive index of the second region for the optical mode.

In a second aspect of the disclosure, a device is described, the device comprising: a first region made of a semiconducting material and having a first bulk refractive index; and a second region, having a second bulk refractive index, made of a dielectric material and configured to confine an optical mode during operation of the device, wherein: a thickness of the first region is constant, the first region comprises a central region having a constant width, and at least one tapered region on a side of the central region, the at least one tapered region has a monotonically decreasing width, during operation: in the central region of the first region, the optical mode is at least 80% confined within the first region, in the at least one tapered region, the optical mode is adiabatically and gradually coupled from the first region into the second region, and outside the central region and outside the at least one tapered region, the optical mode is confined at least 80% within the second region, the first bulk refractive index is higher than the second bulk refractive index, and an effective refractive index of the at least one tapered region of the first region monotonically decreases with the monotonically decreasing width of the at least one tapered region.

In a third aspect of the disclosure, a method is described, the method comprising: providing a device comprising: a first region having a first bulk refractive index, the first region made of a semiconducting material; and a second region having a second bulk refractive index, the second region made of a dielectric material and configured to confine an optical mode during operation of the device, wherein: the first bulk refractive index is higher than the second bulk refractive index, a first effective refractive index of the first region for the optical mode is lower than the first bulk refractive index, and the first effective refractive index is equal to or lower than a second effective refractive index of the second region for the optical mode, and a thickness of the active region is 150 nm or less; and confining at least 80% of the optical mode within the second region.

In a fourth aspect of the disclosure, a method is described, the method comprising: providing a device comprising: a first region having a first bulk refractive index, the first region made of a semiconducting material; and a second region having a second bulk refractive index, the second region made of a dielectric material and configured to confine an optical mode during operation of the device, wherein: the first bulk refractive index is higher than the second bulk refractive index, a thickness of the active region is constant; and controlling an effective refractive index of the first region to confine the optical mode more than 50% within the first region or more than 50% within the second region.

DETAILED DESCRIPTION

The present disclosure describes methods and devices that guide and confine electromagnetic modes across the interface between a material with a low refractive index and a material with a high refractive index. For example, a high refractive index material may include photon generation, while a low refractive index may have low optical loss. High index materials may comprise semiconducting materials suited for light emission, modulation, and detection, among other functions. By moving an optical mode between the two materials, several technological advantages can be achieved. As known to the person of ordinary skill in the art, when in the presence of materials of varying refractive index, light tends to "prefer" that with the highest index. This principle guides current techniques for the confinement and guiding of light, for example in optical fiber communications. The confinement of light in materials of lower index in the presence of materials of higher index is more challenging to achieve as it is contrary to this fundamental principle. If forced to do so, light will eventually find its way (i.e. "leak") into the materials with a higher index, with undesirable or unintended results.

Similarly, as in an optical fiber, light can also be confined and guided in a planar orientation as in, for example, photonic integrated circuits (i.e. optical chips), where materials in a layered configuration form light-confining and light-guiding structures (i.e. optical waveguides). Examples include optical chips based on III-V semiconductors, e.g. GaN, GaP, GaAs, InAs, InP, along with their ternary and quaternary compound alloys, and group IV semiconductors such as silicon (Si), and germanium (Ge).

Materials such as those listed above are compatible from a light confinement perspective, as they are of similar refractive indices. On the other hand, it is advantageous to confine light in materials of lower refractive index, e.g. silicon nitride ($Si_3N_4$), silica ($SiO_2$), alumina ($Al_2O_3$), tantalum pentoxide ($Ta_2O_5$) and other oxide-based dielectrics to take advantage of properties such as low linear and nonlinear optical loss, strong optical nonlinearities, and wide-band optical transparency. Utilizing these low refractive index materials as functional layers for light guiding and confinement, along with materials with a high refractive index, is currently precluded by the fundamental challenge, described above, of light's behavior in the presence of greatly dissimilar indexes. An example of such currently prohibited application would be that of a semiconductor laser based on a III-V semiconductor as the gain (i.e. light-emitting) medium, but with the larger fraction of the optical energy confined in a low-index region. The material with a low refractive index and the material with a high refractive index can be chosen according to the specific application, however in all embodiments the material with a low refractive index has an index lower than that of the material with a high refractive index.

Current approaches to attempt to combine materials with dissimilar indexes are limited to the brute force butt-coupling of light between materials either on separate chips or on the same chip as well as through the use of intermediary materials or layers. In either case, these approaches, being inherently non-scalable, prevent higher degree of system scaling and miniaturization, a trend critical for enabling technological solutions with increasingly improved performance and greatly reduced size, weight, and power consumption footprint. It would, thus, be highly desirable to achieve the cooperative integration of low and high index materials in an optically seamless and direct (i.e. without employing intermediary materials) fashion.

The present disclosure describes the confinement and guiding of light in low-index media in the presence of high-index semiconductor materials, and the electrical control of the resulting devices. The present disclosure describes the control of the thickness of a III-V semiconductor (or other high index medium) for the purpose of achieving lossless and tight confinement of light in the low index medium. The present disclosure also describes the electrical control through injection (or sweeping) of carriers (i.e. current) in a lateral (i.e. parallel to the III-V layer) configuration (e.g. lateral current injection). In some embodiments, the coupling between different layers is carried out through the evanescent tail of the optical mode, while in other embodiments the coupling is adiabatic.

While some embodiments of the present disclosure focus on silicon nitride (SiN) and III-V semiconductors (i.e. InP) as the low and high index materials respectively, the methods described herein can be generalized to a wide array of low and high index material combinations. Likewise, while some embodiments of the present disclosure focus on light emission (i.e. lasers), the methods can be applied to a broader set of optical functions, e.g. light modulation, detection etc. For example, applications in nonlinear optics can include frequency shifting, frequency mixing and generation (e.g. frequency combs), microwave photonics, and quantum information processing. Nonlinear interactions benefit disproportionately from high optical intensities, so that most of the progress in the field is taking place in integrated waveguide geometries, including high-Q resonators. The requisite pump is typically a coherent laser beam fed in from the outside, usually from a narrow-linewidth fiber or external cavity laser. It would be a major boon to the development of this field if a high-coherence pump source could be incorporated on chip and that is precisely one of the embodiments described in the present disclosure. The material chosen in this example is silicon nitride, to circumvent detrimental two-photon absorption, which allows integration of the laser source within the nonlinear platform, and a laser mode maximally confined in SiN. This embodiment allows enhancement of the spectral purity of the pump signal, and increases the robustness and stability of the pumping process. The optically purest form of silicon nitride is $Si_3N_4$, and it is commonly referred to as SiN.

The main challenge for this embodiment lies in confining light in the low-index SiN, in the presence of a high-index (III-V) semiconductor. To meet that challenge, two key enabling methods are introduced: (a) the use of an ultra-thin (~100 nm) III-V semiconductor film as a gain medium and (b), the lateral injection of carriers into the active region. Therefore, in some embodiments, the high refractive index material has a thickness of 100 nm or less. Through optical confinement in low-loss SiN, and placement of the active medium in the evanescent tail of the laser mode, leveraged control over the spontaneous emission rate (i.e. quantum noise) is enabled. For a material with the optical quality of SiN, temporal coherence levels equivalent to quantum-limited linewidths below 100 Hz can be achieved. Such ultra-low phase noise performance lends itself to the parametric generation of accordingly "pure" lines. While the maximum allowable ("critical") thickness in the case of SiN is 100 nm, this critical thickness may vary with the bulk refractive indexes of the constituent materials.

Crucial for the functioning of a laser as an on-chip pump source is its ability to reach the necessary output power levels. The underlying condition for this requirement, especially on heterogeneous material platforms, is effective thermal management. To this end, a rigorous thermal analysis is carried out, and a mitigation strategy, based on the device's unique characteristics, is described. Output powers in excess of 50 mW are achievable.

Similar approaches as described with reference to nonlinear optics can also be applied to "pushing" the fundamental limit of integrated laser coherence, paving a path toward battery-powered sources of non-classical light (e.g. squeezed and entangled light) and quantum interfaces (e.g. quantum frequency conversion), as well as enabling chip-scale, multi-spectral processing across an increasingly essential part of the electromagnetic spectrum (UV to mid-IR).

Integrated nonlinear photonics has brought the speed and agility of all-optical signal processing to the chip level with commensurate improvements in scale and efficiency. For this revolution in miniaturization to reach its natural destination and for the full breath of its benefits to be harvested, a solution for the self-contained powering of nonlinear optical chips is required. Typically employed sources include high-power fiber, external cavity, and mode-locked lasers. The sheer size and nature of these sources render them inherently incompatible for miniaturization and integration. In addition to impeding system integration and scaling, the power source accounts for the largest, by far, chunk of the power budget. Added to this is the premium to compensate for optical losses sustained upon coupling to the chip. The ability to power nonlinear optical chips from within would, therefore, enable access not only to the ultimate limit in scaling and miniaturization, but also to a reduction by orders of magnitude in power consumption and cost.

The integration of a pump source should be pursued neither as an end in itself nor via a brute force-type approach, if it is to become an asset and not a liability for the total system. Therefore, careful consideration of the nonlinear platform and seamless integration with it is vital. SiN has a third-order optical nonlinearity $\chi^{(3)}$ roughly an order of magnitude smaller than that of Si. However, unlike Si, SiN is virtually free from nonlinear losses (i.e. two-photon and free-carrier absorption) in the important optical telecommunication bands between 1.3 and 1.6 micrometers. SiN also possesses a high enough refractive index (2.0) to provide tight optical confinement for strong nonlinear interaction and laying out of compact circuits. More importantly, though, SiN offers a much lower loss potential than Si, as demonstrated with high-confinement resonators in SiN reaching quality factors Q in excess of 10 million and, in some cases, as high as 70 million. Coupled with the absence of nonlinear loss and the option for dispersion engineering for phase matching, SiN continues to support decreasing threshold powers for parametric oscillation.

Therefore, in some embodiments, SiN is utilized as the low index material. FIG. 1 illustrates an example of an on-chip powered, optical parametric oscillator (OPO). An electrically pumped semiconductor laser (SCL) is used to power an OPO in the form of a high-Q SiN resonator. FIG. 1 illustrates confinement of the optical mode within the SiN material (105). An InP layer constitutes the high index material (115), which in this example is tapered (120) at one end of the device, partially overlapping the SiN waveguide (130). A high Q SiN resonator is also illustrated (110).

Key to the integration approach is the choice of a high-confinement mode in SiN (>80%) for the laser mode. Therefore, in some embodiments, 80% or more of the optical mode or optical power is confined within the low index material, while 20% or less is present in the active high index material. This choice is driven by a confluence of motivating factors: (a) leveraged control over the laser spontaneous emission rate and, thus, the (quantum) phase noise of the pump, (b) near-lossless delivery of pump power to the SiN optical circuit, and (c) enhanced robustness and stability of system operation. It does come, though, with significant challenges. Confining light in the low-index SiN in the presence of the high-index (III-V) semiconductor represents a major challenge in and of itself, as described above. Additionally, for the laser to perform its role as a pump, it needs to be capable of delivering the requisite amounts of power. The present disclosure describes the key methods to meet those challenges and to satisfy the set criteria.

Figure 2:
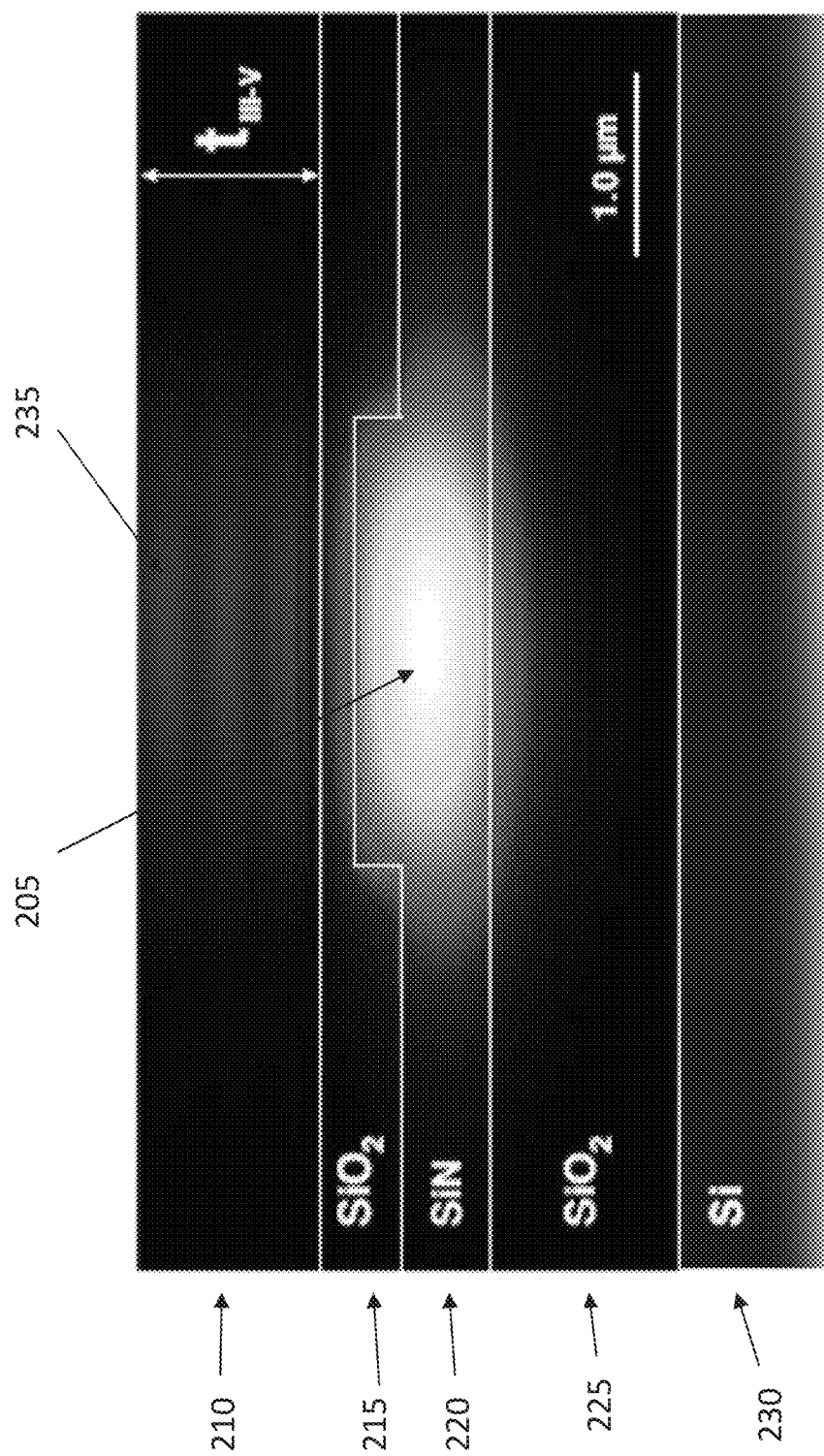
FIGS. 2-4 illustrate the electric field mode distribution (TE) as a function of the III-V film thickness, $t_{III-V}$.

In the following, an exemplary embodiment is described of a semiconductor laser on silicon nitride, using an ultrathin III-V semiconductor layer on SiN. The integration of a semiconductor laser source on SiN will be carried out by keeping the optical mode predominantly confined in SiN. Given the knowledge available for devices which are heterogeneously integrated SCLs on Si, the Si/III-V platform can be used as a reference to highlight the special challenges facing laser integration on SiN. Thanks to its refractive index of 3.46, comparable to that of most III-V semiconductors, Si can be easily designed for high mode confinement. That same condition is, however, not readily satisfied in SiN. Due to its lower refractive index of 2.0, tight optical confinement in SiN in the vicinity of III-V semiconductors is difficult. If, for example, the Si layer of a Si/III-V SCL is simply replaced with SiN, the resulting structure would support a range of III-V-guided and SiN leaky eigenmodes. An example of such leaky eigenmodes is shown in the simulation of FIG. 2. This mode does not fulfill the set condition of maximal confinement in SiN.

Figure 3:
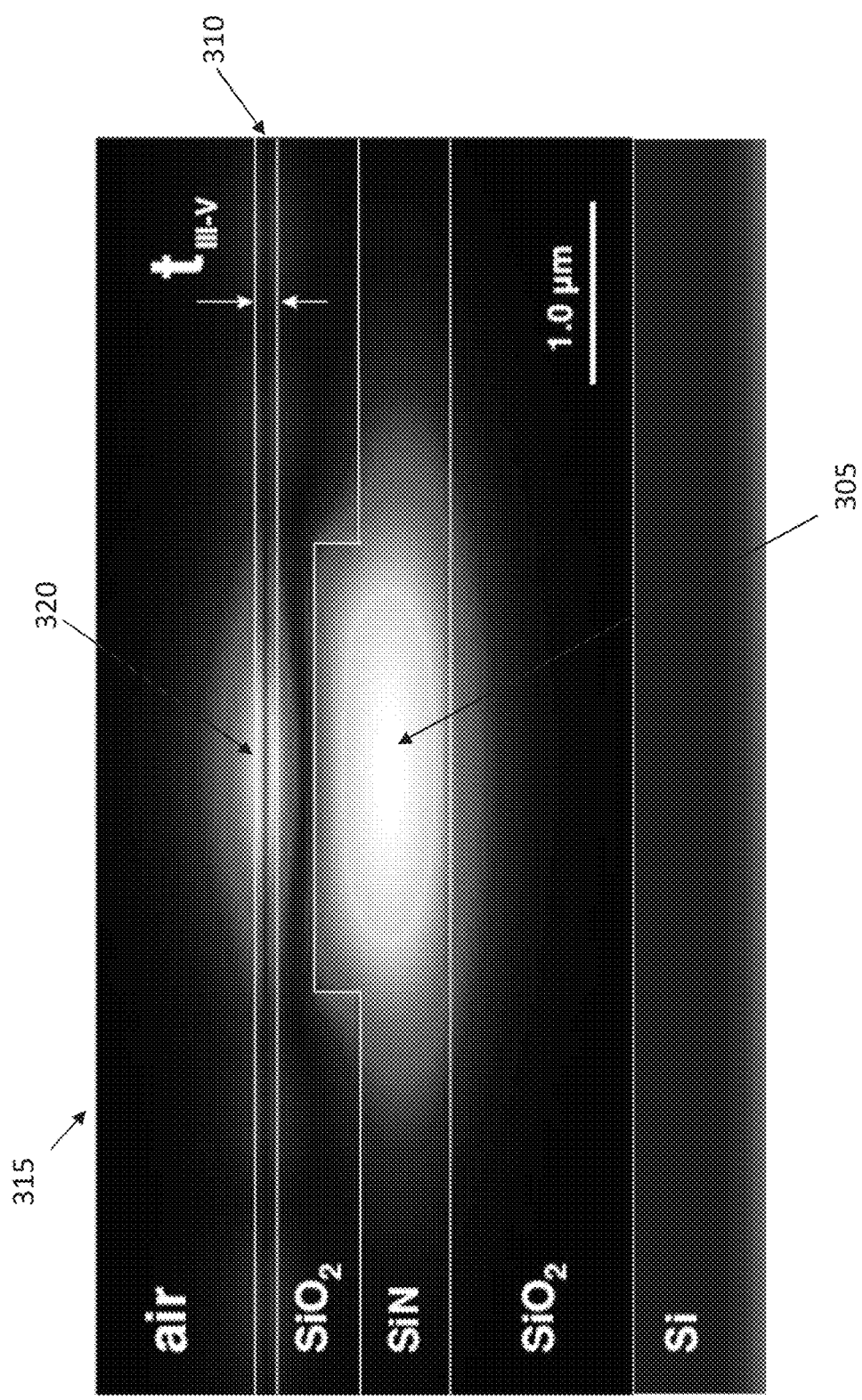
Figure 4:
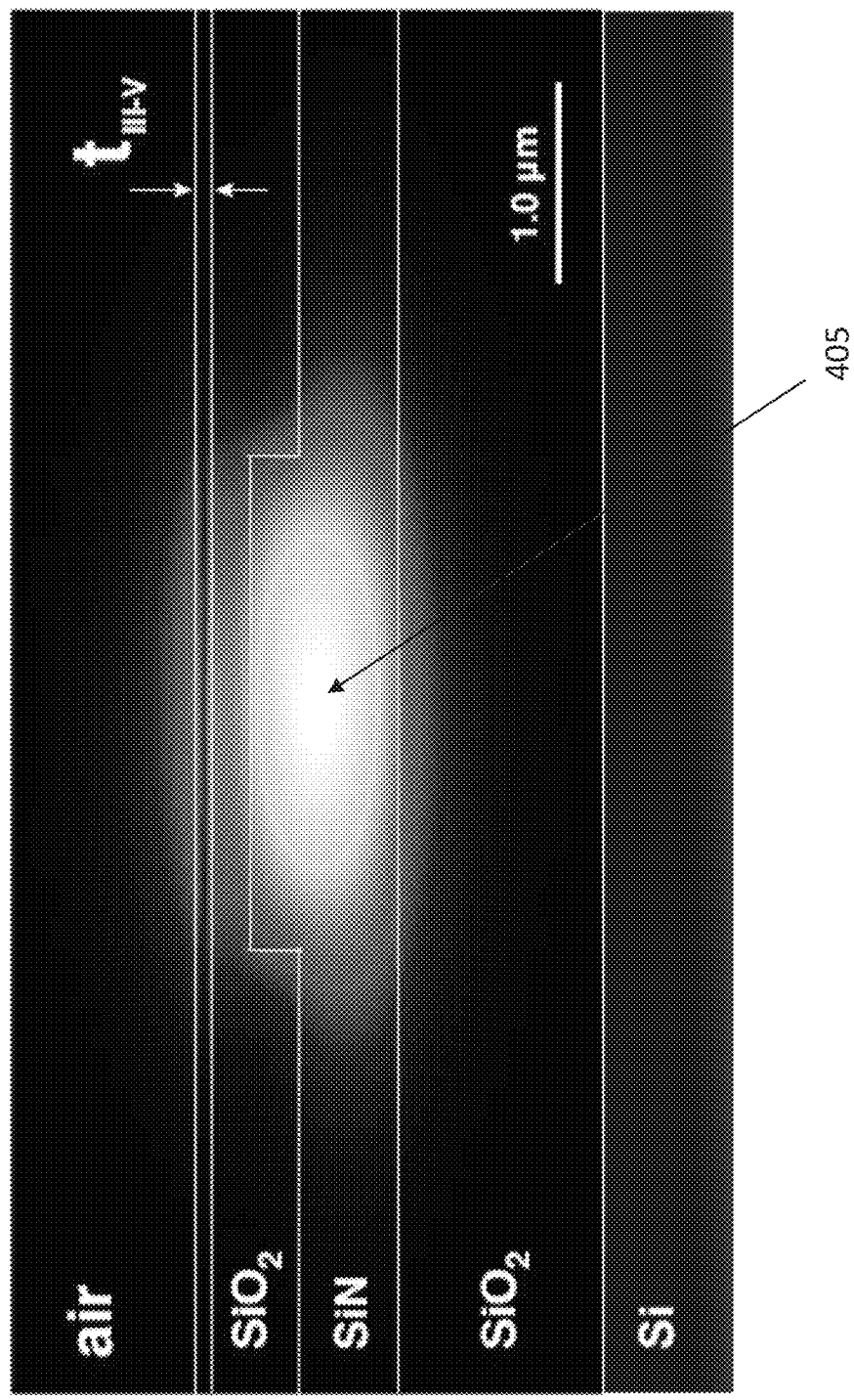

FIGS. 2-4 illustrate the electric field mode distribution (TE) as a function of the III-V film thickness, $t_{III-V}$: in FIG. 2 for $t_{III-V}=1$ micrometer, energy leaks vertically into the III-V; in FIG. 3 for $t_{III-V}=125$ nm, energy leaks in-plane in the III-V semiconductor; and in FIG. 4 for $t_{III-V}=75$ nm, tight, low-loss confinement in SiN is obtained. FIG. 2 illustrates the optical mode (205) in the SiN layer (220), with significant leakage (235) in the III-V layer (210). Silicon dioxide layers (215, 225) are present at the interfaces, and the substrate is Si (230). FIG. 3 illustrates similar layers, but the III-V layer is now much thinner (310), and an air layer is also illustrated (315); the optical mode (305) also has significant leakage (320). FIG. 4 illustrates similar layers to those of FIG. 3, including an air layer, but in this case the mode is well confined (405) in SiN.

Figure 5:
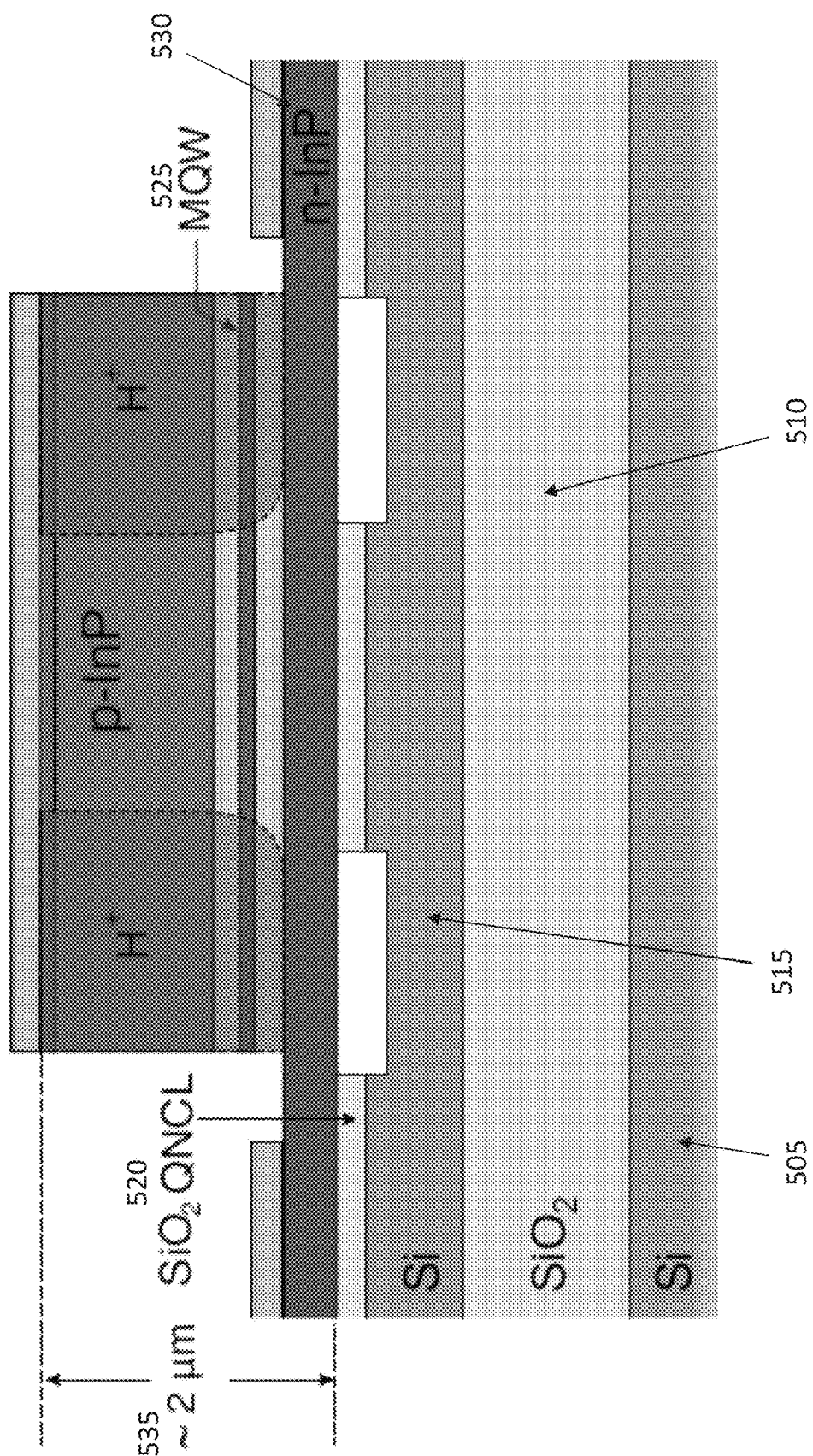
FIG. 5 illustrates a cross-sectional structure of a typical Si/III-V laser.
Figure 6:
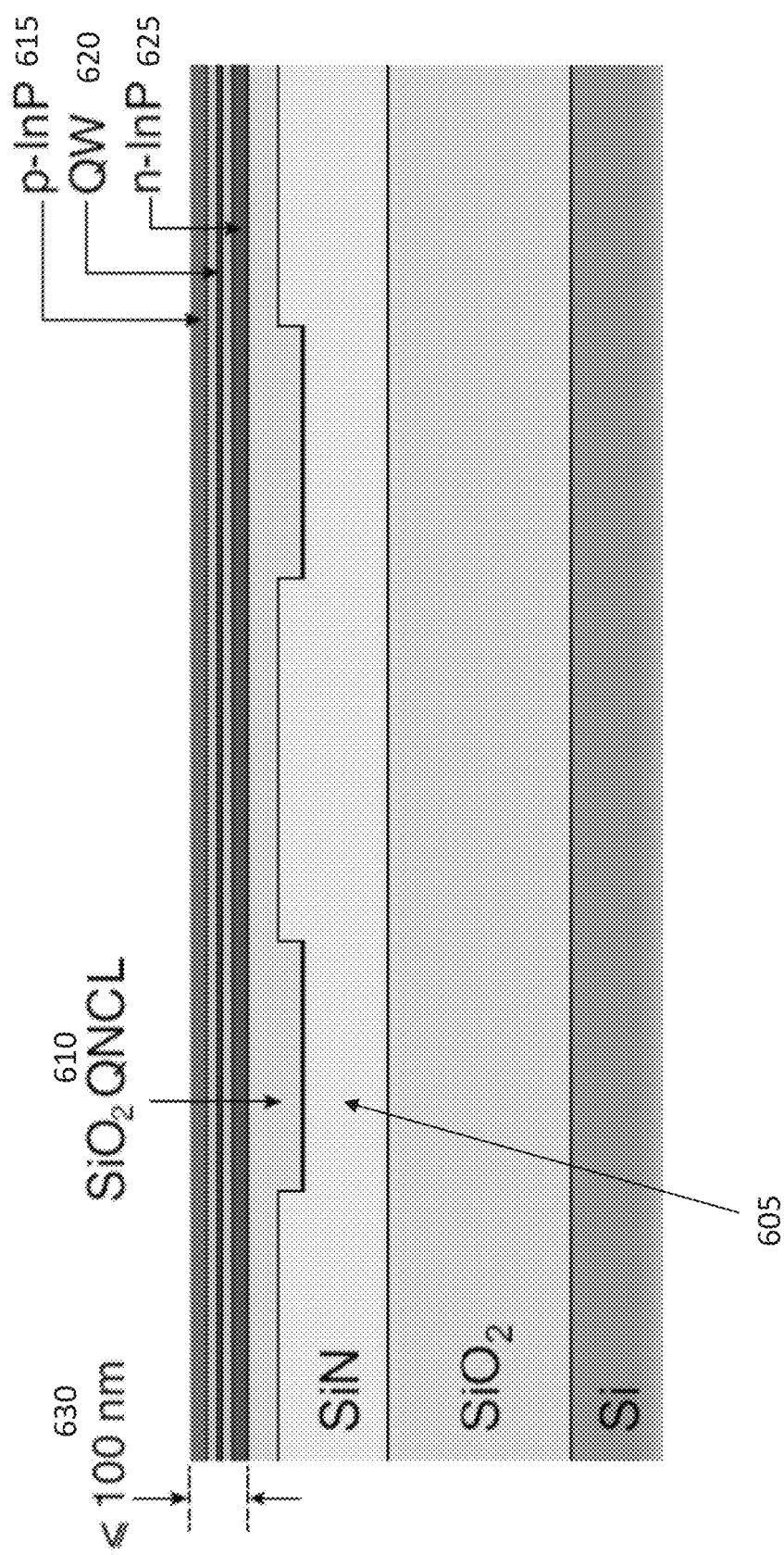
FIG. 6 illustrates a cross-sectional structure according to the present disclosure.

To overcome leaking of the optical mode, the present disclosure describes a drastic reduction of the thickness of the III-V epi-structure. The result is illustrated with the evolution of the fundamental SiN TE mode with decreasing III-V film thickness ($t_{III-V}$) in the simulated examples of FIGS. 2-4. While decreasing the thickness of the III-V layer, a transition of optical leakage from vertical in FIG. 2, to in-plane in FIG. 3 is obtained at first. In the case of FIG. 3, the total III-V thickness is a slightly over 100 nm. Reducing it further to about 100 nm or less causes the effective index of the III-V film to drop below that of the optical mode, sharply cutting off in-plane leakage, as seen in FIG. 4. FIGS. 5-6 show a comparison of the structure of a typical Si/III-V SCL (FIG. 5) with that of a SiN/III-V structure according to the present disclosure (FIG. 6), with the relative III-V thickness drawn to qualitative scale for FIG. 6 relative to FIG. 5. A thickness reduction of a factor of nearly 20 over typically employed III-V thicknesses is required in this case to enable modal confinement in SiN greater than about 80%. It is known in the art that a successful transfer of high-quality, ultra-thin III-V films onto non-native substrates via bonding is currently possible down to 7 nm, for application in both photonics and electronics.

FIG. 5 illustrates a typical III-V and Si structure, with a Si substrate (505), a silicon oxide layer (510), a Si layer (515), and a III-V structure on top, comprising a quantum noise control layer (QNCL,520), an n-doped InP layer (530), and a multiple quantum well (MQW) layer (525). The III-V structure has a thickness of about 2 micrometers (535).

The thickness of the SiN layer is not sufficient, by itself, for light confinement. While a minimum thickness has to be used, for a specific device, no thickness can satisfy the confinement requirement by itself. The choice of thickness in this embodiment, between 700 and 800 nm, is dictated by the provision for access to the regime of anomalous group velocity dispersion (GVD), around 1.55 micrometers, for efficient parametric interaction. A minimum thickness of low-index material is required for the maximal optical confinement in the low-index material in the presence of a high-index material to be possible. However no specific value of thickness, however large, can achieve the intended result by itself. A drastic reduction of the thickness of the high-index material is also necessary. The specific thickness of 700-800 nm for the SiN in this embodiment is chosen for the purpose of optimization for nonlinear optical interaction in the infrared wavelength range (e.g. 1.3-1.55 micrometers).

FIG. 5 illustrates a cross-sectional structure of a typical Si/III-V laser. FIG. 6 illustrates a cross-sectional structure according to the present disclosure. The thickness of the III-V film (in this case, InP) is reduced from about 2 micrometers in FIG. 5 to about 100 nm in FIG. 6. The air trenches around the waveguide ridge are filled for mechanical support with $SiO_2$, also doubling up as a QNCL, and planarized for bonding to the III-V. The main differences in FIG. 6 compared to FIG. 5 are that in this embodiment a SiN layer is used (605), and the InP structure is much thinner. The QNCL is also used (610), while the InP structure comprises a p-doped layer (615), a quantum well (QW,620), and an n-doped layer (625). The total thickness is less than 100 nm (630).

Figure 7:
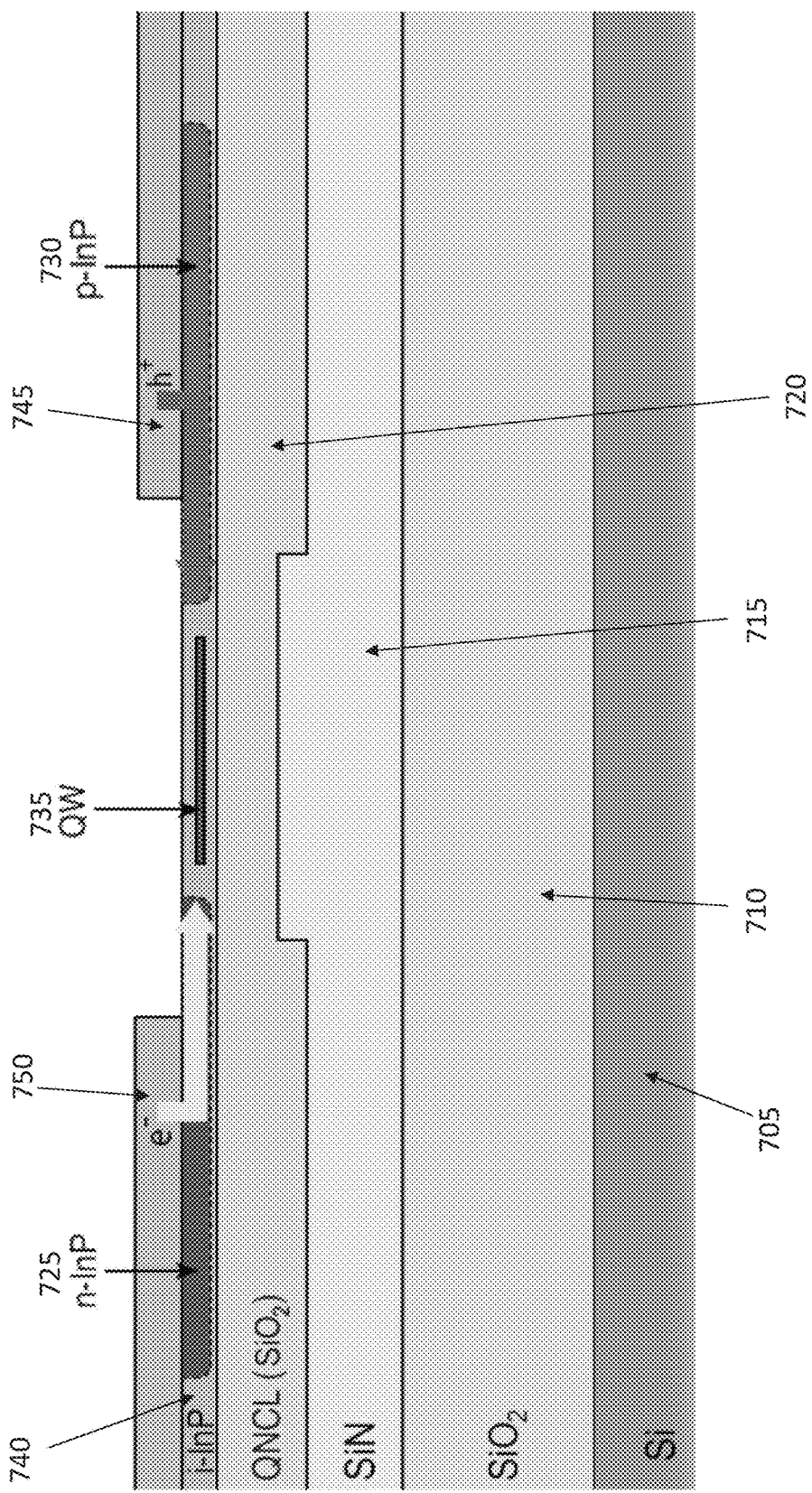
FIG. 7 illustrates a cross-sectional structure of an electrically pumped SiN/III-V laser according to the present disclosure.

The requisite III-V thickness reduction can come, in part, at the expense of legacy semiconductor layers, originally introduced on native substrates (e.g. separate confinement structure and waveguide cladding layers). In the limit of very small confinement in the III-V, which this laser is trending toward, the presence of these layers, especially as it pertains to optical confinement, is rendered redundant. There is still, however, the requirement for current injection. At a reduced thickness of the order of 100 nm, conventional injection normal to the QW becomes prohibitive, as it involves retaining a metal electrode in close proximity to the optical mode. To circumvent this new challenge originating from the thickness reduction, lateral injection of carriers can be used. The lateral injection method injects carriers parallel to the QW from in-plane n- and p-doped regions on either side of the active region, as illustrated in FIG. 7. Carriers injected in this way flow, primarily, through the QW due to the equivalent p-i-n diode's lower turn-on voltage, a result of the smaller bandgap energy of the QW material's (e.g. InGaAsP), relative to that of the surrounding layers (e.g. InP).

Lasers that use this type of injection can be referred to as transverse-junction lasers. Normally, there is a tradeoff between carrier transport requirements and carrier localization requirements. By confining the mode in the low index material as described in the present disclosure, it is possible to remove the necessity for such a trade-off, thus obtaining new degrees of freedom for optimization (i.e. stronger carrier confinement) and re-designing of the SCL structure.

Key to the operation of a transverse-junction laser is the strong lateral confinement of carriers, provided by lateral hetero-barriers, as well as the forming of carrier-injecting regions. Both of these conditions rely on high-temperature processing (~610° C.), necessary, for example, for epitaxial regrowth and dopant activation. While such processes are strictly forbidden in current heterogenous integration, due to the excessive thermal stress induced on the typical micron-thick III-V films, they are remarkably enabled as a viable option by the dramatic reduction in III-V film thickness described in the present disclosure. For example, below approximately 400 nm of III-V thickness, the thermal stress induced during processing at the requisite temperatures becomes sufficiently small, as evidenced through negligible crystal degradation.

Another key consideration in lateral injection is the width of the active stripe. Specifically, it should be kept at or below a value determined by the ambipolar diffusion length. Due to the large difference in mobility between electrons and holes, if the width of the active stripe is made much wider than the ambipolar diffusion length, recombination will occur increasingly closer to the p-side end of the stripe, yielding a non-uniform and asymmetric gain profile across the active region. This in turn creates uncertainty in the prediction of the modal overlap between the mode and the gain profile, key input to the laser design process. Typical diffusion lengths for InP at room temperature are on the order of 1 micrometer. The down-scaling of the transverse size of the active region does, however, have a beneficial side-effect, as it lends to a significant reduction of the per-unit-length threshold current. In particular, this threshold current can be reduced by a factor greater than 5, compared to conventional heterogeneous SCLs, allowing improved thermal management, as discussed below in the present disclosure.

FIG. 7 illustrates a cross-sectional structure of an electrically pumped SiN/III-V laser according to the present disclosure. The laser comprises a Si substrate (705), a silicon dioxide layer (710), a SiN layer (715), a QNCL layer (720), an intrinsic InP layer (740) comprising an n-doped region (725) and a p-doped region (730), and a QW (735) layer. Electrons are injected laterally on one side (750), while holes are injected laterally from the other side (745).

As illustrated in FIG. 7, charge carriers are injected laterally and parallel to the QW from in-plane, doped regions on either side of the active region (735). The stripe-shaped, active region is formed by etching and epitaxial regrowth of intrinsic InP (i-InP). The doped regions are formed successively by ion implantation (e.g. Si for n-type) and/or thermal diffusion (e.g. Zn for p-type), followed by rapid thermal annealing for dopant activation. The reduced film thickness lowers the thermal stress budget significantly, critically enabling high-temperature processing (600-650° C.).

For every laser to output useful amounts of power, effective thermal management is important. This is especially true for SCLs on heterogeneous platforms where the presence of thermal barriers in the heat conduction path raises the overall thermal resistance, resulting in early thermal roll-off and power saturation. Pump power is, of course, an all-important metric in nonlinear applications. It is, thus, important that an on-chip pump source be able to reach requisite power levels. To that end and before any thermal management strategy can be devised, it is instructive to study and understand the self-heating behavior of the specific laser structure at hand.

Figure 8:
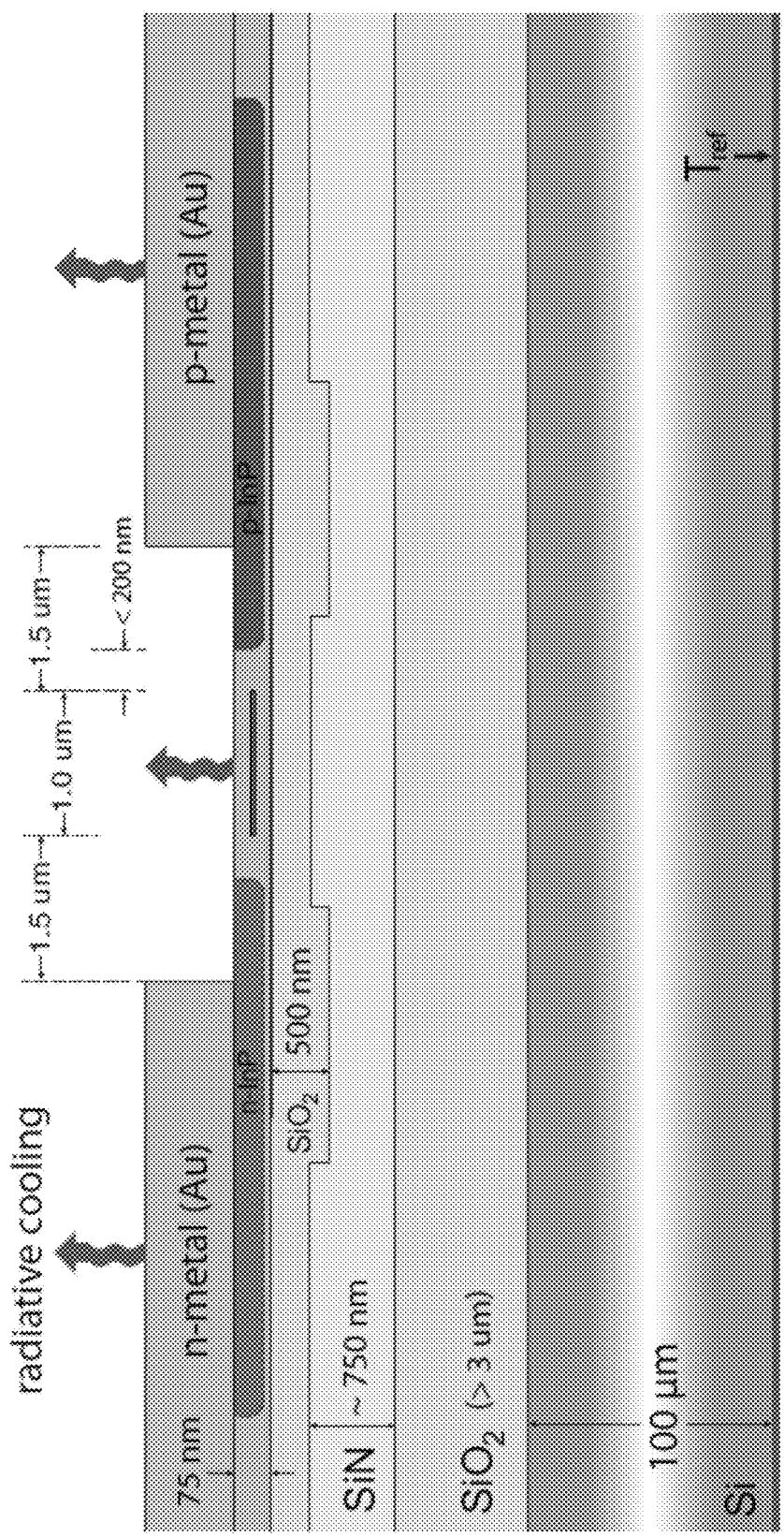
FIGS. 8-9 illustrate an exemplary laser and its thermal conduction profile.
Figure 9:
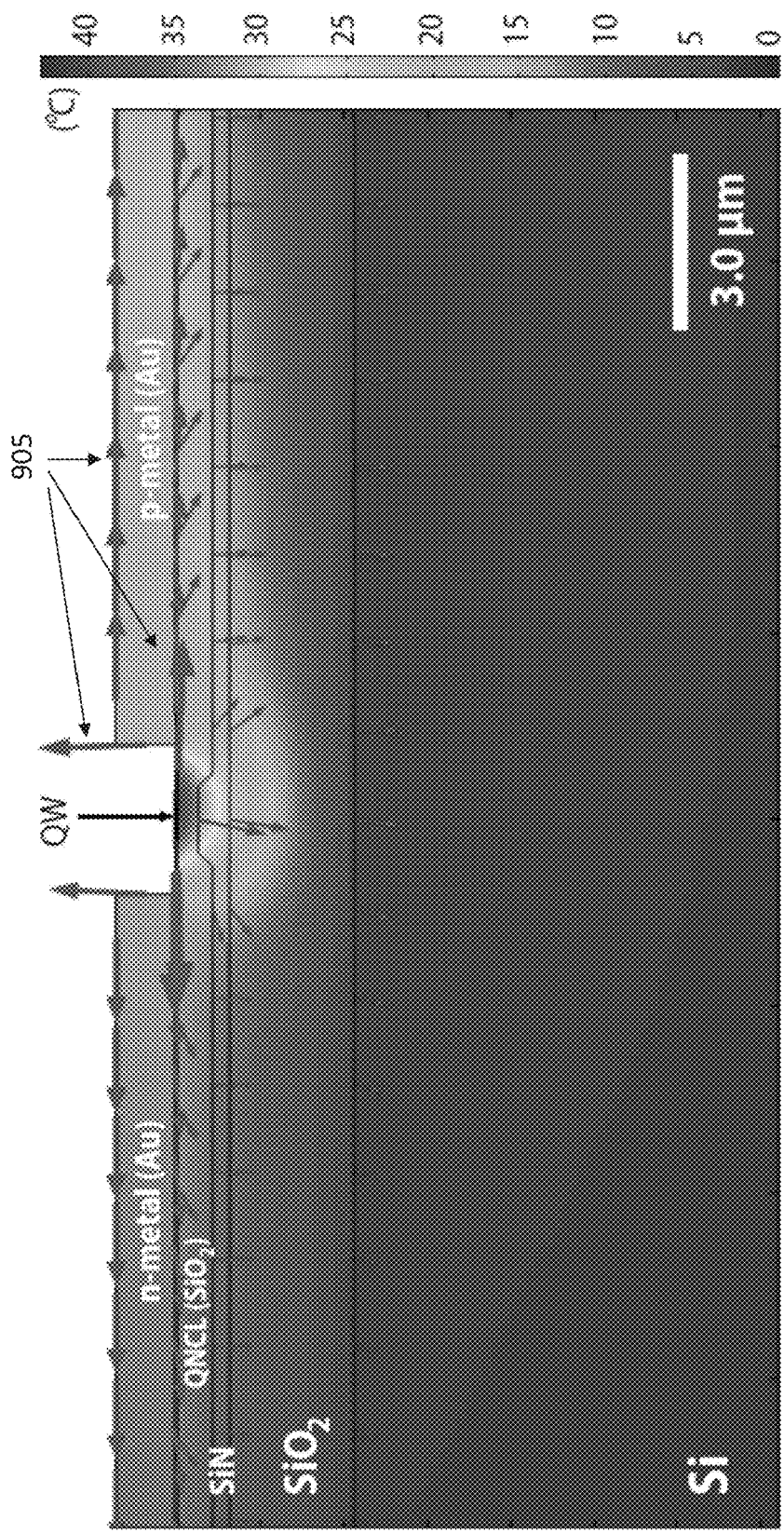

To analyze thermal management, the two dimensional (2D) heat transfer equation was solved for the laser of FIG. 8, and the relative temperature rise across the structure is plotted in FIG. 9. The laser of this example was taken to be 1 mm long and driven with a current of 100 mA. Dissipation for both resistive and active regions (i.e. optical absorption and non-radiative recombination) is accounted for. The simulation makes use of published values for the material thermal conductivities and electrical properties of the III-V semiconductors. The temperature increase is with reference to an externally set temperature ($T_{ref}$) applied to the backside of the Si substrate (i.e. a heat sink). The bulk of the heating occurs along the path between the p-doped contact and the active region, as well as within the active region itself. This is reflected in the asymmetry of the temperature distribution about the active region. The temperature increase in the active region at the driving current of this example is substantial, but partly mitigated by a lateral heat spreading effect provided by the combined effect of the close proximity of the metal electrodes to the heat source and the relatively high thermal conductivity of InP. Even so, this performance will most certainly not suffice to reach the requisite power levels. An additional mitigation strategy is, thus, deemed necessary. The arrows (905) in FIG. 9 are for the total heat flux plotted in logarithmic scale.

It is estimated that a laser designed according to the specifications of FIG. 8 would exhibit a threshold current no higher than about 5 mA for a length of 1 mm. This estimate includes the non-radiative (i.e. Auger recombination) component, dominant at 1.55 micrometers, and it is also remarkably low despite the intentionally designed, for coherence control purposes, small confinement in the active region. The reason for this is two-fold: (a) the expected reduction in optical loss by virtue of confinement in the low-loss SiN and (b) the necessitated transverse scaling of the active region, as explained above. The estimated threshold is more than 5 times lower than that of typical, vertical-injection heterogeneous SCLs of the same length and creates a unique opportunity: drastic scaling of the length for the purpose of thermal management. Increase of the length of the laser yields a proportional reduction of the series resistance and heat density (at a given current), as well as a proportional reduction of the threshold current. With the small starting value for the threshold current of this example, ample room for length scaling is available before this increase becomes unsustainable. This rationale was tested by repeating the simulation of FIG. 8 for varying laser lengths.

Figure 10:
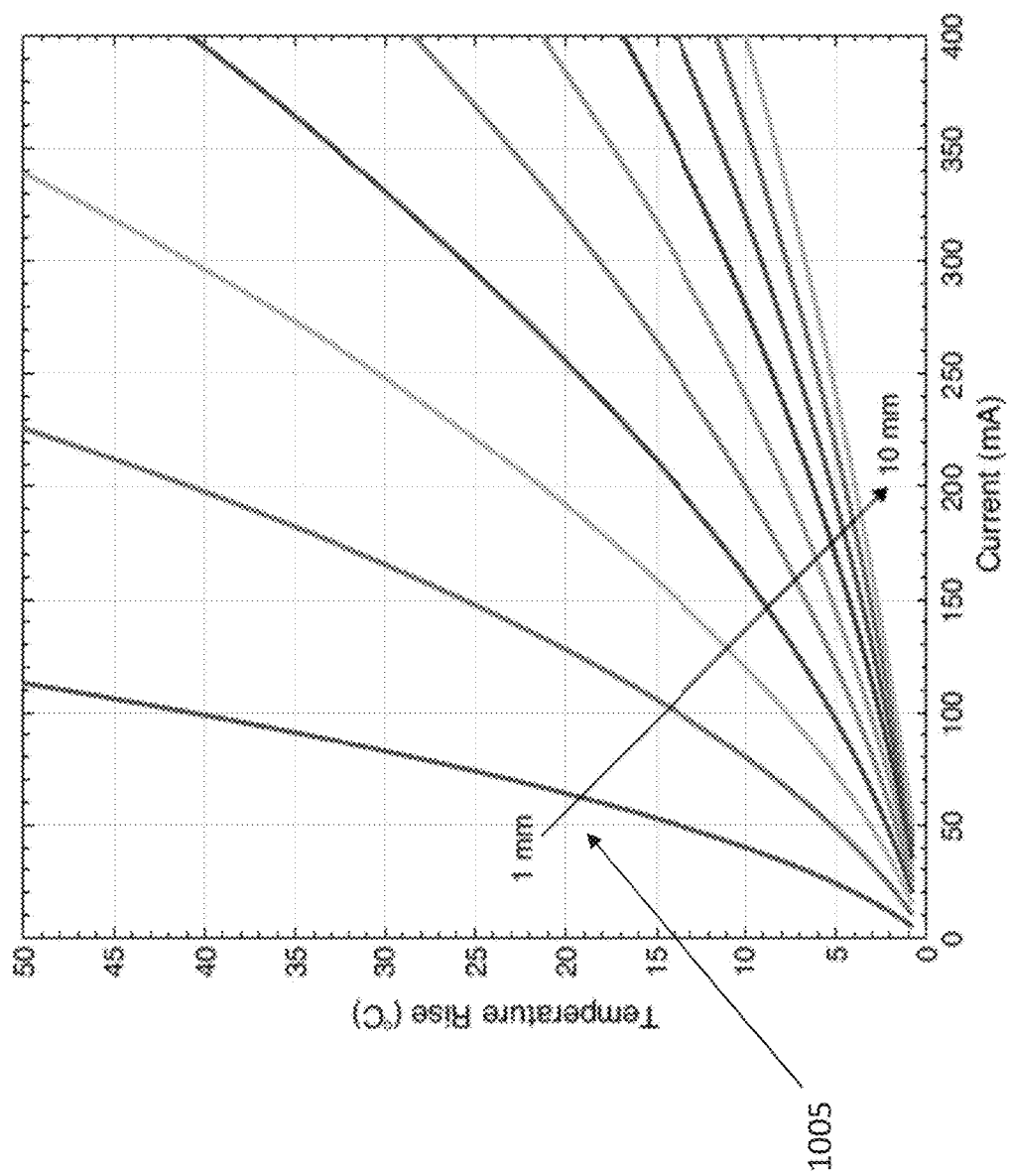
FIG. 10 illustrates the temperature increase in the active region for lengths between 1 mm and 10 mm as a function of the driving current.
Figure 11:
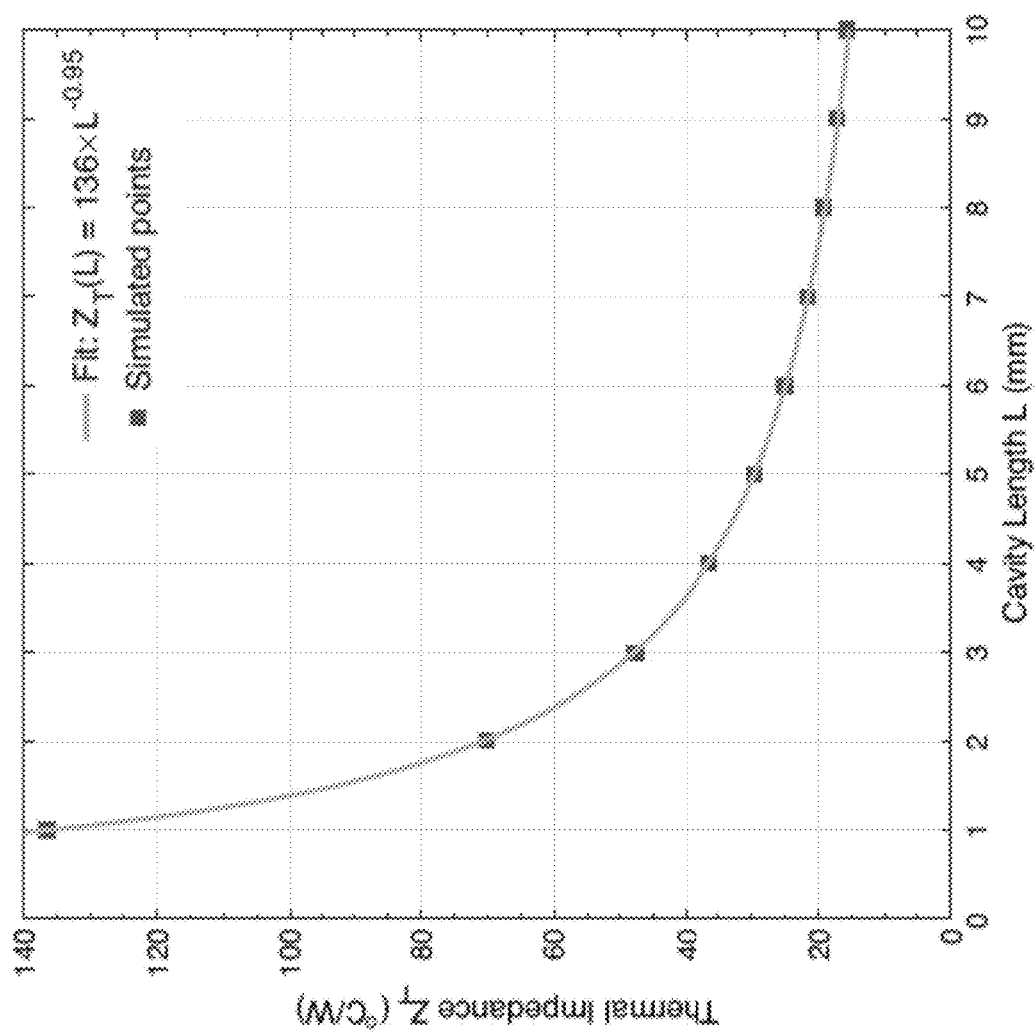
In FIG. 11, the average thermal impedance is plotted as a function of laser length.

FIG. 10 illustrates the temperature increase in the active region for lengths between 1 mm and 10 mm (1005) as a function of the driving current. A clear trend of decreasing heating is observed, especially pronounced in the range between 1 and 5 mm. The same design parameters as in FIG. 8 are used. In FIG. 11, the average thermal impedance is plotted as a function of laser length, obtaining a 1/L scaling behavior. By a length of 5 mm, the SiN laser's thermal impedance has dropped to a value comparable to that of native-substrate III-V SCLs. While a significant length increase is required for bringing its thermal impedance on par with that of shorter (thermally optimized) lasers, its threshold current is still comparable, if not smaller than that of its shorter counterparts.

Figure 12:
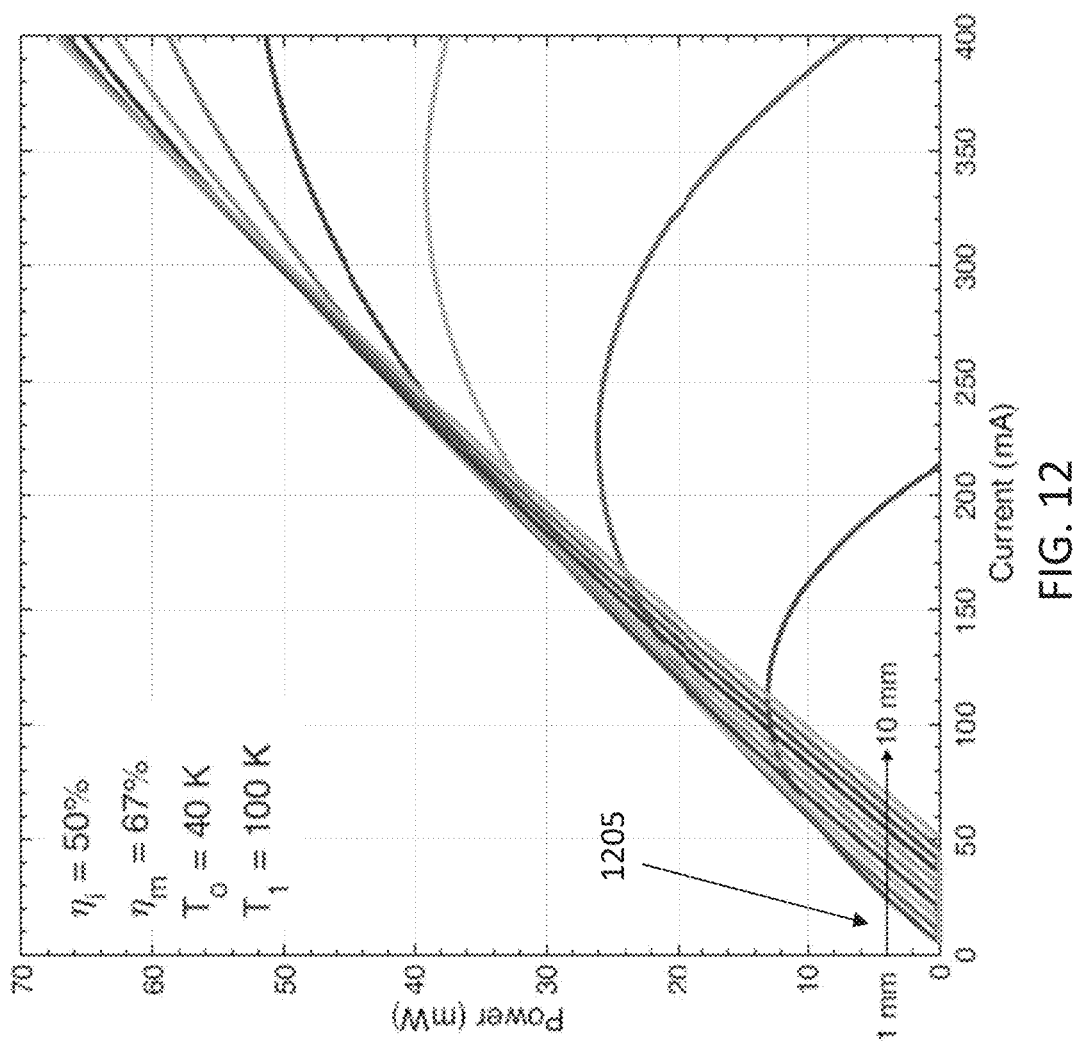
FIG. 12 illustrates theoretically predicted L-I characteristics for lasers of varying length

With the data of FIGS. 10-11, predictions about the power performance of the SiN laser can be made. The output power is calculated in an iterative manner, accounting for the self-heating effect. The predicted L-I characteristics are presented in FIG. 12. Assumptions for the internal quantum efficiency (i) (above threshold) and the characteristic temperatures ($T_o$, $T_1$) have been made. For the former, an average of recently reported, experimental values for lateral-injection SCLs on non-native substrates was used, while for the latter, typical values for InP-based SCLs have been assumed. A progressive "delaying" of the thermal roll-off is observed with increasing length, as expected from the decreasing thermal impedance. Above a length of about 5 mm, constant differential quantum efficiency is sustained up to a current of 400 mA. A maximum output power of nearly 70 mW is reached, limited primarily at that point by the internal quantum efficiency (IQE). Further length scaling yields diminishing returns, as the resistance contribution to heating has become negligible. Even so, the predicted power levels are well above the requisite thresholds for on-chip, parametric oscillation using high-Q SiN resonators and, perhaps, even sufficient for the most power-demanding of nonlinear applications, such as octave-spanning frequency comb generation. Higher output powers could be obtained by extending the pumping range or, more effectively, by improving the IQE. The lifting off of legacy trade-offs, as discussed above, and the opportunity for an ab initio overhaul of the design of the SCL's active region, create an opportunity for such improvement to be possible. FIG. 12 illustrates theoretically predicted L-I characteristics for lasers of varying length. The direction of length increase is indicated (1205).

A laser based on a mode predominantly confined in SiN also has the ability to control the (temporal) coherence of the light generated. The fundamental factor limiting laser coherence is quantum phase noise due to spontaneous emission into the laser mode. This factor depends on the upper-state population ($N_{2t}$, conduction band electron number for SCL), clamped at its threshold value, and the spontaneous transition rate (in $s^{-1}$) of emission into the laser mode, $W_{sp}^{(\ell)}$. The spontaneous transition rate is a quantum mechanical property of the interaction of light with matter, and can be shown to be proportional to the normalized modal intensity of the electric field at the position of the emitter. This parameter will be referred to as $|\bar{E}_\ell(\bar{r}_a)|^2$, where $\bar{r}_a$ denotes the location of the emitter and "$\ell$" the laser mode. Countering the effect of spontaneous emission is the population of coherent light quanta stored in the laser mode, $n_\ell$, the product between the injected-current increment above threshold and the total photon loss rate in the mode. The latter total photon loss rate is inversely proportional to the cold-cavity, loaded quality factor Q of the mode.

Figure 14:
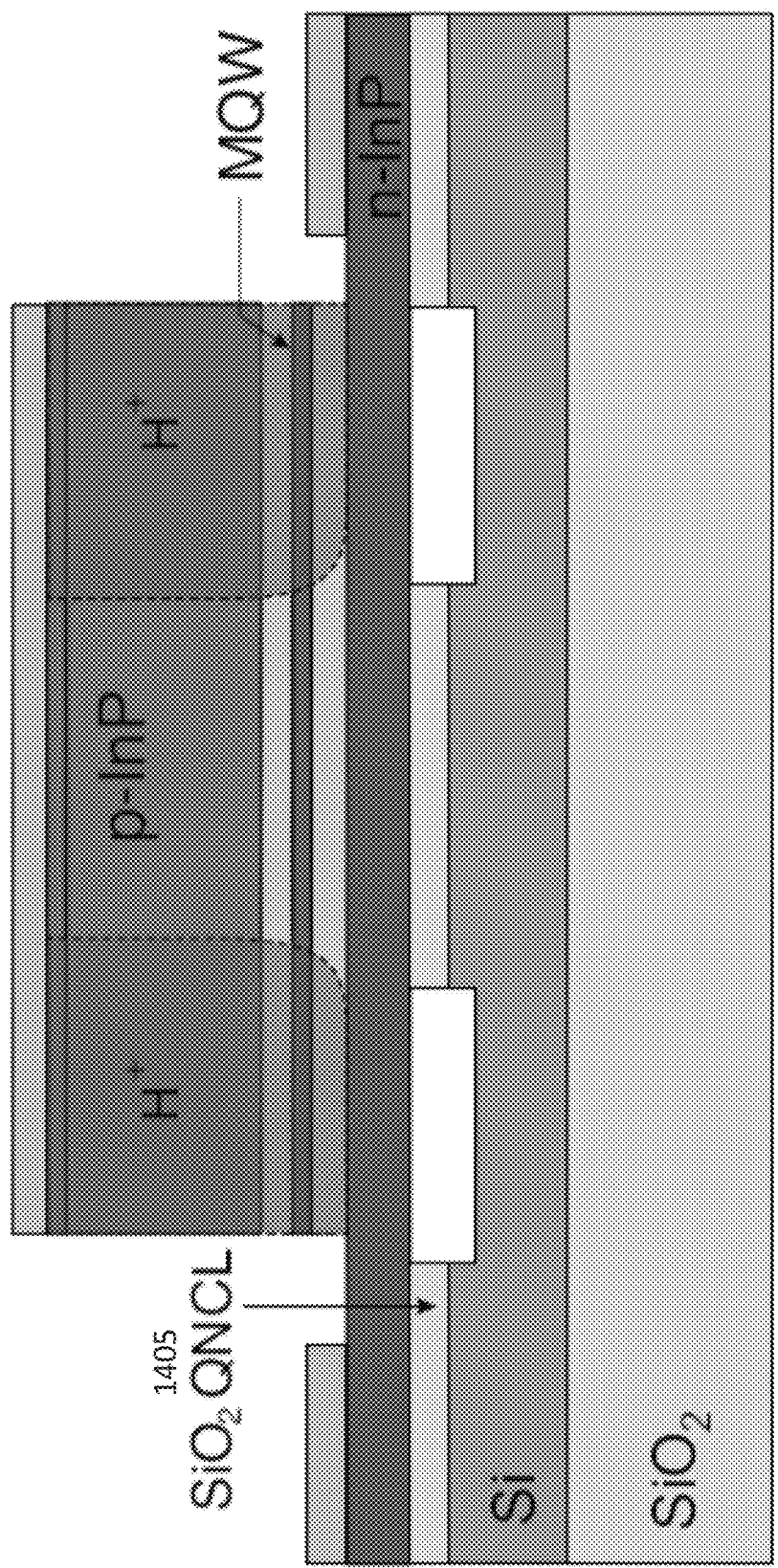
FIGS. 14-17 illustrate the structural and modal characteristics of a Si/III-V SCL exemplifying quantum noise control.
Figure 15:
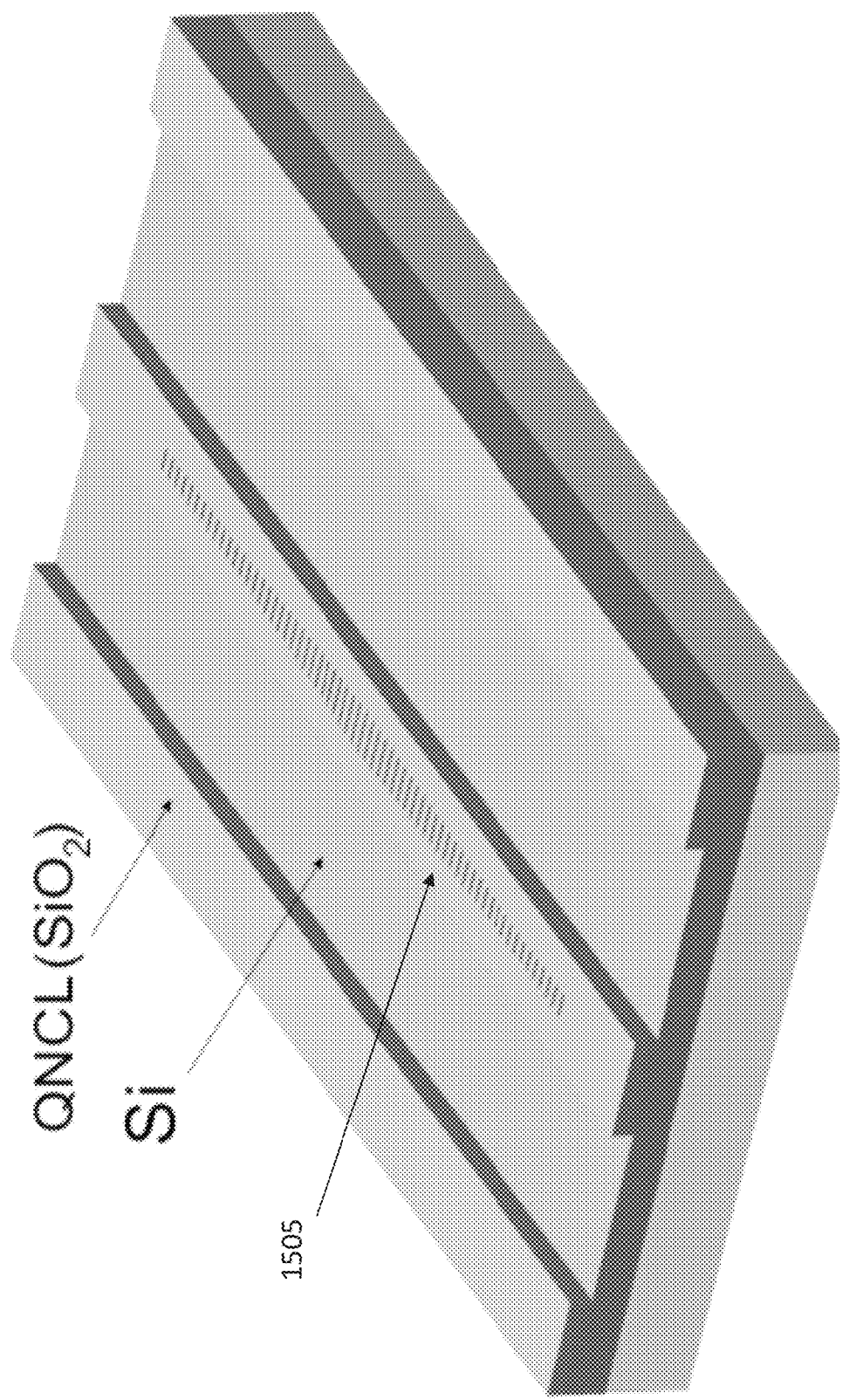
Figure 16:
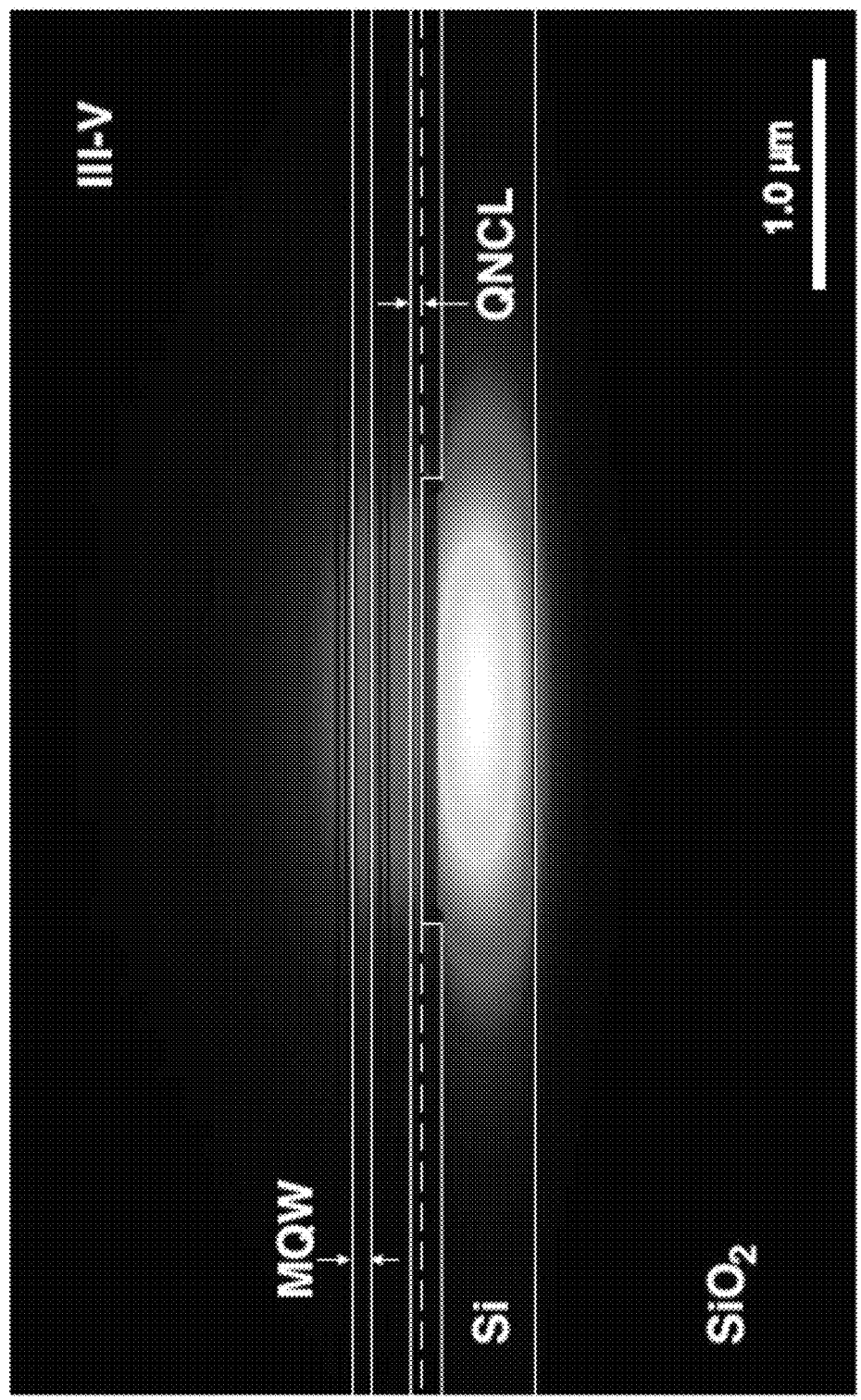
Figure 17:
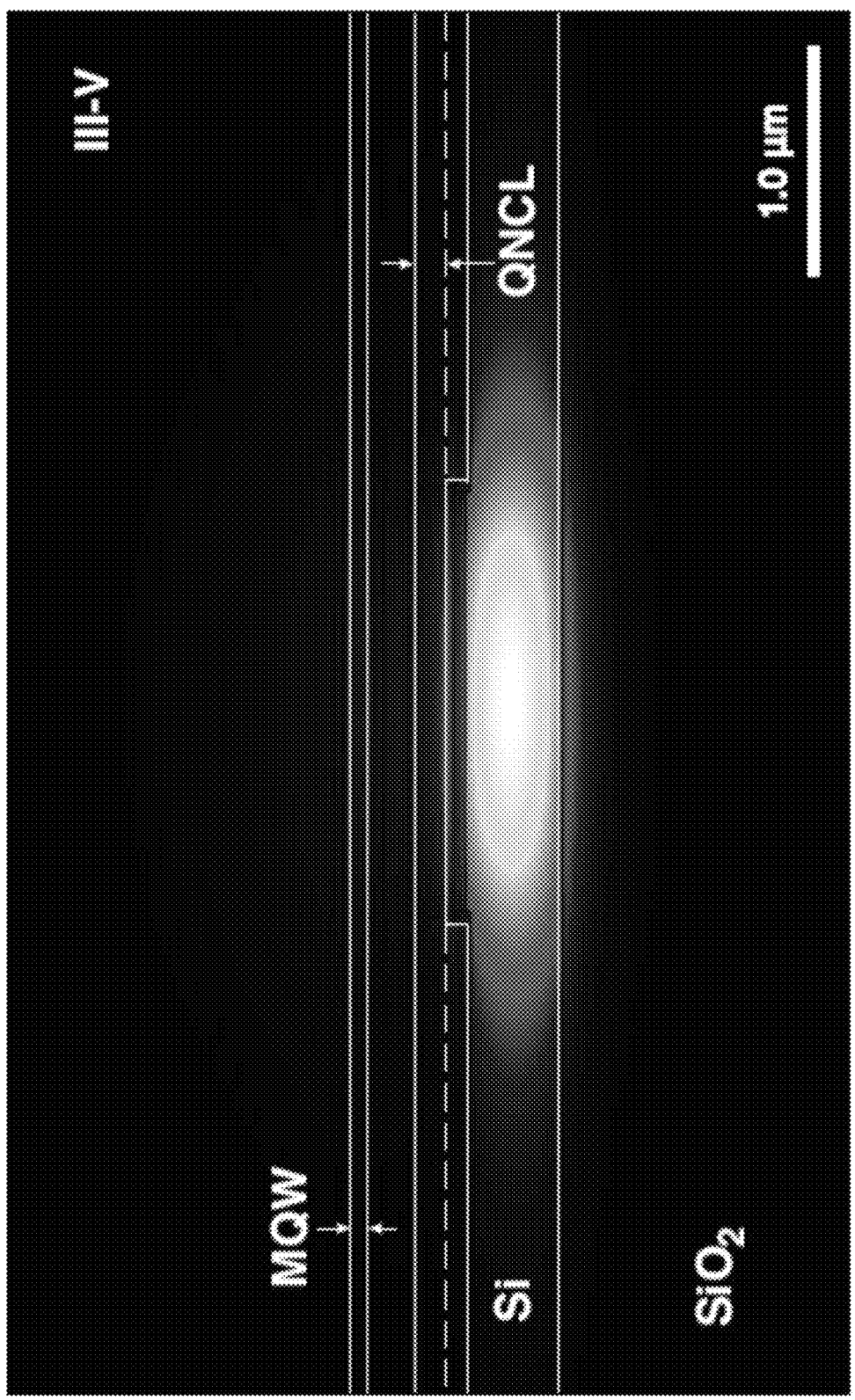

FIGS. 14-17 illustrate the structural and modal characteristics of a Si/III-V SCL exemplifying quantum noise control. A relatively thick (50-150 nm) low-index layer (e.g. $SiO_2$) placed between Si and the III-V semiconductor provides a "lever" for the control of the spontaneous emission rate into the laser mode by way of $W_{sp}^{(\ell)}$. This layer will be referred to as "QNCL" (quantum noise control layer). The QNCL layer is illustrated in FIG. 14 (1405). By controlling the thickness of the QNCL, the normalized intensity of the laser mode in the QW, $|\bar{E}_\ell(\bar{r}_a)|^2$, is controlled in a highly leveraged fashion, as illustrated by the examples of FIGS. 16-17. For as long as losses in the III-V semiconductor (e.g. free-carrier absorption) dominate the total modal loss, the "pulling" of modal energy out of the III-V semiconductor and into the lower-loss Si results in a net reduction of the total loss (i.e. the stored photon number increases). The net reduction in total loss is paralleled by a reduction of the spontaneous emission rate into the laser mode. It is in this III-V semiconductor loss-limited regime that the decrease in modal gain is almost completely offset by the decrease of modal loss, thus keeping the threshold point practically unchanged. The figure-of-merit for the threshold penalty-free margin of quantum noise reduction is the loss level in Si, characterized by an equivalent quality factor $Q_{Si}$.

Figure 18:
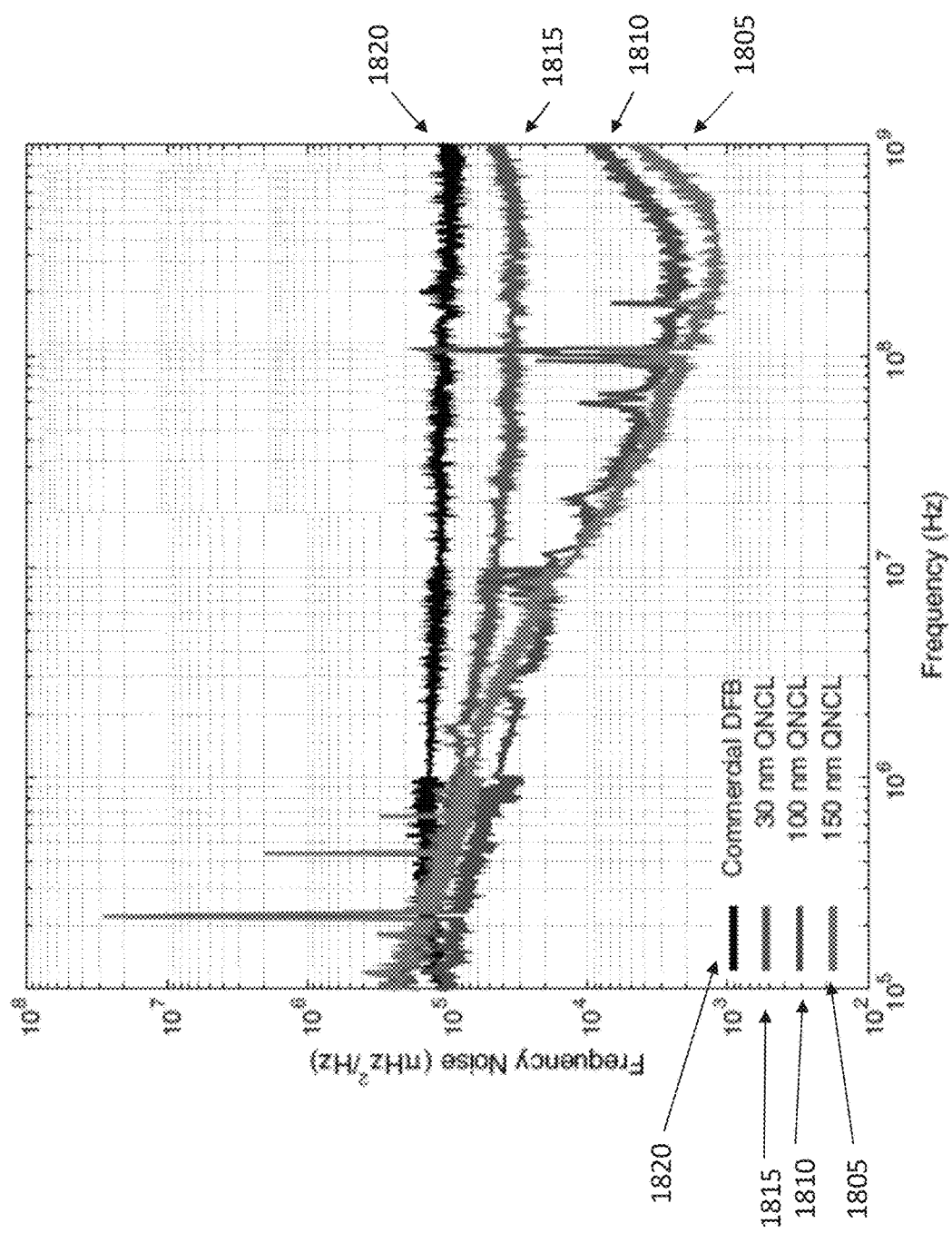
FIG. 18 illustrates an experimental demonstration of quantum noise control.

The experimental signature of quantum noise control is shown in FIG. 18. The frequency noise spectra of lasers with QNCL of varying thickness are plotted, alongside the spectrum of a commercial distributed feedback laser (DFB). All lasers were pumped at equivalent current increments above threshold. The unloaded $Q_{Si}$ of the QNCL lasers was approximately 1 million. It can be observed that increasing the QNCL thickness decreases quantum noise (white frequency noise level), with an improvement of more than two orders of magnitude over the DFB laser. The minimum frequency noise level for the thickest QNCL laser (150 nm) corresponds to a quantum-limited linewidth of about 1 kHz.

FIG. 14 illustrates structural and modal features of a Si/III-V SCL exemplifying quantum noise control. A cross-sectional structure of a heterogeneous Si/III-V laser is shown, comprising a $SiO_2$ spacer layer (QNCL,1405) between Si and the III-V semiconductor. The QNCL layer enables precise, nanometer-scale control of the modal field intensity $|\bar{E}_\ell(\bar{r}_a)|^2$ at the position of the emitter $\bar{r}_a$ and, thus, of the spontaneous emission rate, $W_{sp}^{(\ell)}$, into the laser mode. FIG. 15 illustrates a 3D perspective view of the low-loss grating (1505) etched in Si for longitudinal confinement and frequency control. FIGS. 16-17 illustrate simulated normalized electric field of the laser mode ($TE_0$), for two disparate values of the QNCL thickness, showing the highly leveraged nature of the control over modal intensity. FIG. 16 illustrates the optical mode for a QNCL thickness of 50 nm, while FIG. 17 illustrates the optical mode for a QNCL thickness of 200 nm.

FIG. 18 illustrates an experimental demonstration of quantum noise control. Frequency noise spectra are plotted for Si/III-V SCLs of varying QNCL thickness, and for a commercial DFB (1820). FIG. 18 plots data for QNCL of 30 nm (1815), 100 nm (1810), and 150 nm (1805). For a fair comparison, all spectra were taken at the same current increment above each laser's threshold. The plotted frequency noise corresponds to an equivalent instantaneous linewidth, $\pi \times S_{Av}(f)$. The noise increase observed in the case of the QNCL lasers above roughly 300 MHz is due to phase noise injected by the erbium-doped fiber amplifier (EDFA) utilized for the measurements.

Similar to the case of a QNCL of silicon dioxide, confining the mode of a SiN SCL in the low-loss SiN layer affords control over the phase noise quantum of the pump light, and a potential for ultra-low phase noise pumping. The latter has been shown to be a requisite for the parametric generation of low-phase noise carriers as in the case, for example, of low phase noise-state frequency combs. Such high-spectral purity lines can, in turn, be utilized either directly in the optical domain, or after down-conversion to the microwave range, as agile high-data capacity carriers or high-fidelity local oscillators. An added benefit arising from the seamless and intimate integration of the pump within the nonlinear platform is the robustness of the pumping process itself. This is usually done by tuning of the pump signal into resonance with a mode of the nonlinear element (e.g. high-Q resonator), resulting in a soft "thermal-lock" between them. The lock is subject to temperature-induced fluctuations and drift of both the source and resonator frequencies. Integrating both the source and resonator closely together on the same chip, and embedding them "optically" into the same material, ensure that they both experience the same environmental perturbations, lending to enhanced stability and ruggedized operation.

The concepts and methods described in the present disclosure are scalable with applicability extending beyond the realm of nonlinear photonics. The prospect of obtaining an integrated light source on an optical platform (i.e. SiN) of increasing technological significance creates promise for a pivotal new "push" toward high-performance, integrated photonics, complementing or even, in many cases, upending Si. As described in the section on quantum noise control, confining the optical mode in a low-loss layer of the laser resonator enables direct control over quantum noise, with the maximum margin for reduction limited by the optical quality of the confining material itself. In the case of a Si/III-V SCL, the limit for the fundamental linewidth (i.e. quantum-limited) can be "pushed" down to about 1 kHz, limited by scattering loss in Si ($Q_{Si} \sim 10^6$). With SiN offering a loss potential more than an order of magnitude lower than that of Si ($Q_{SiN} > 10^7$), a SiN laser embodying the same paradigm is expected to "drive" the fundamental linewidth well under 100 Hz, an unprecedented level for an electrically controlled, integrated laser source. A path for bringing fiber laser-grade coherence to chip scale is, thus, opened.

Some of the same nonlinear processes (e.g. four-wave mixing) utilized in the classical regime for wavelength generation and conversion can be employed for their effect on the quantum properties of light. This includes the generation of non-classical states of light (e.g. squeezed light, correlated photon pairs) as well as the conversion between states with preservation of their quantum properties (e.g. quantum frequency conversion). SiN, in particular, with its transparency across the visible and IR is uniquely positioned to serve as a quantum interface platform between qubit storage elements (i.e. memories) in the visible and the fiber network for qubit transmission in the IR. Coupled with solid-state single-photon emitters or even solid-state quantum memories, electrically controlled, chip-scale quantum photonics may soon become a reality.

Finally, the proposed laser integration approach is directly scalable and transferable across the wavelength spectrum, by the mere employment of the appropriate active semiconductor material. For example, what was described above for the case of the optical telecom band (1.31.6) can be transferred to the 700-1000 nm band with the substitution of GaAs—for the InP-based semiconductor, or to the 400-600 nm band with GaN. In this process, all optical design principles remain unchanged, while all necessary processing methods (e.g. epitaxial growth) are readily available for each semiconductor material system. This flexibility creates the potential for either obtaining lasers in integrated form at parts of the EM spectrum where such sources do not currently exist or combining multi-spectral sources on one chip for ultra-broadband solutions.

The combination of high optical coherence with agile nonlinear processing can redefine the paradigm for high-capacity data communications in the next-generation optical coherent networks. Miniaturized optical biosensors are finding increasing application thanks to their faster turnaround, enhanced sensitivity, and high throughput. One particular class of such sensors includes biochemical assays in microfluidically interfaced and optically interrogated platforms.

Given that such assays are often aqueous-based, the interrogating light is restricted at near-visible wavelengths (i.e. water absorption minimum) and, thus, correspondingly compatible optical platforms (e.g. SiN). Integrating the light source with the optical platform would enable fully miniaturized and portable diagnostic, bioanalytical, and health monitoring tools.

Frequency combs provide accurate clockworks as well as a direct link between the optical and microwave domains. They are, thus, versatile tools for optical and microwave frequency synthesis and time keeping. Of particular interest is their interfacing with atomic systems (e.g. Cs, Rb) for the realization of high-stability frequency standards. Direct interfacing of such systems at their natural resonant wavelengths (e.g. 600-800 nm) on chip is expected to pave the way to chip-scale atomic clocks with greatly enhanced precision and stability in unprecedented-small form factor. These are bound to not only impact the next-generation civilian applications relying on precise positioning, navigation, and timing (e.g. GPS).

Figure 19:
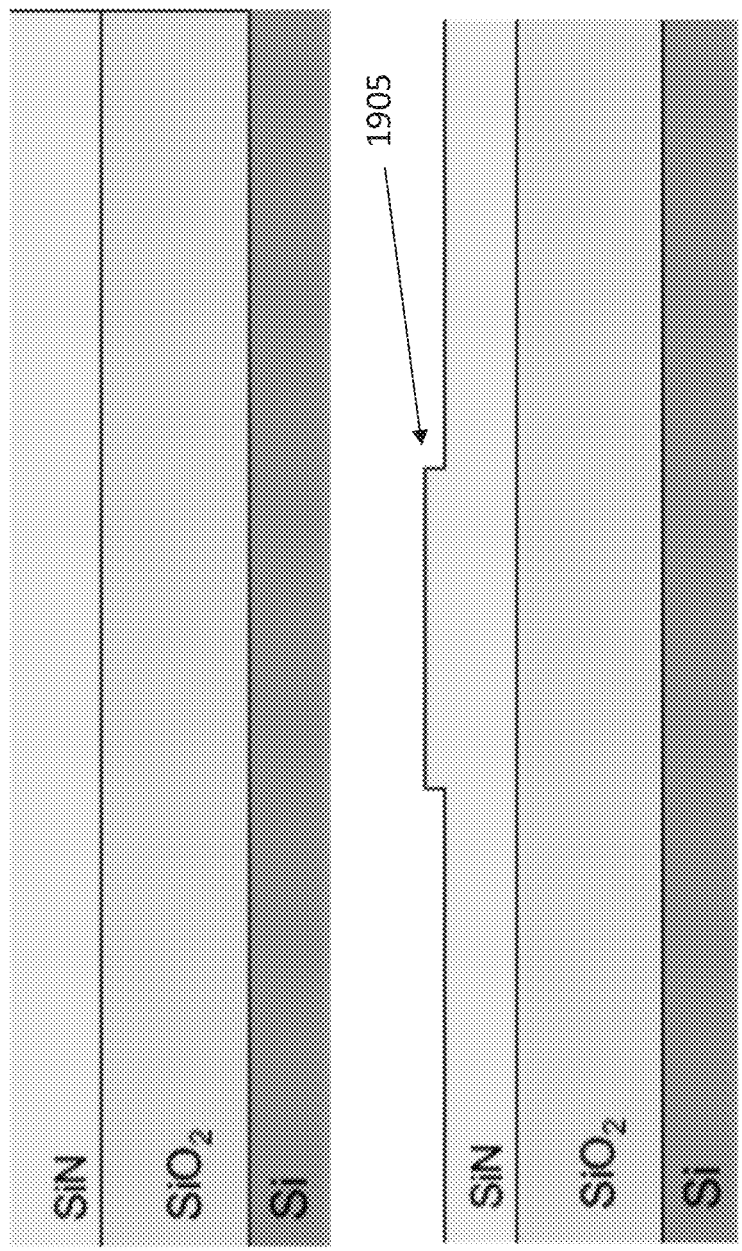
FIGS. 19-24 illustrate an exemplary method of fabrication.
Figure 20:
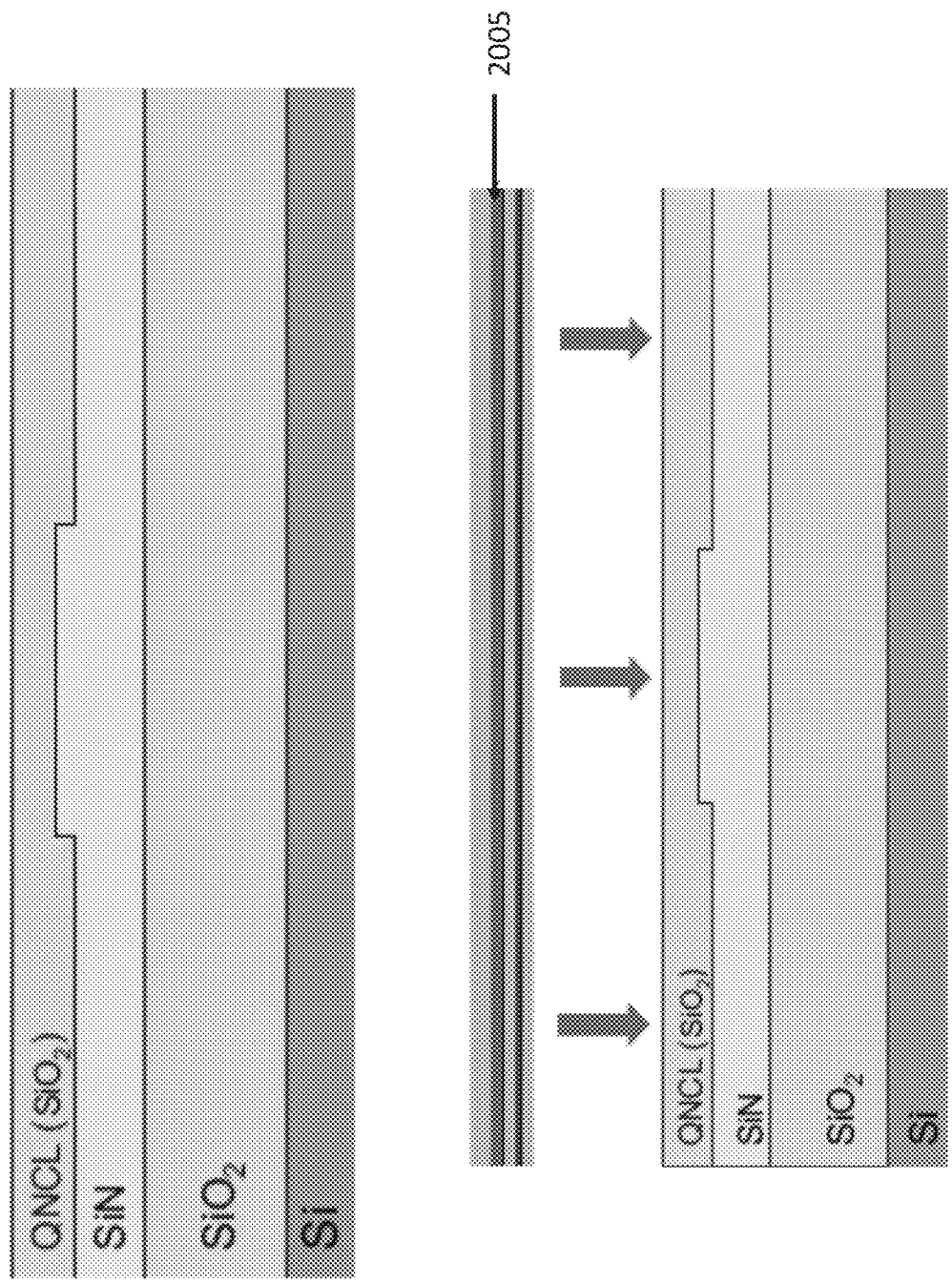
Figure 21:
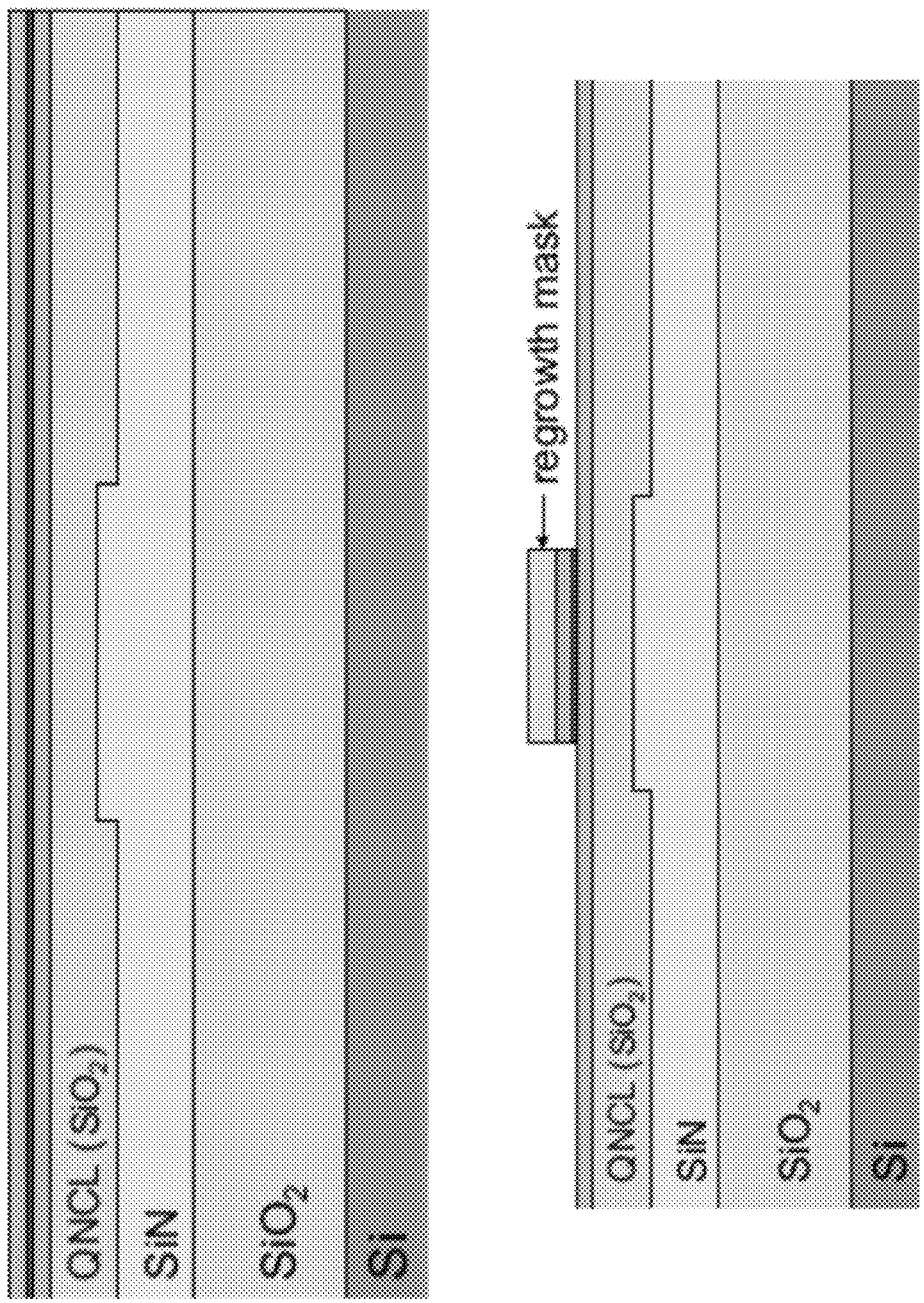
Figure 22:
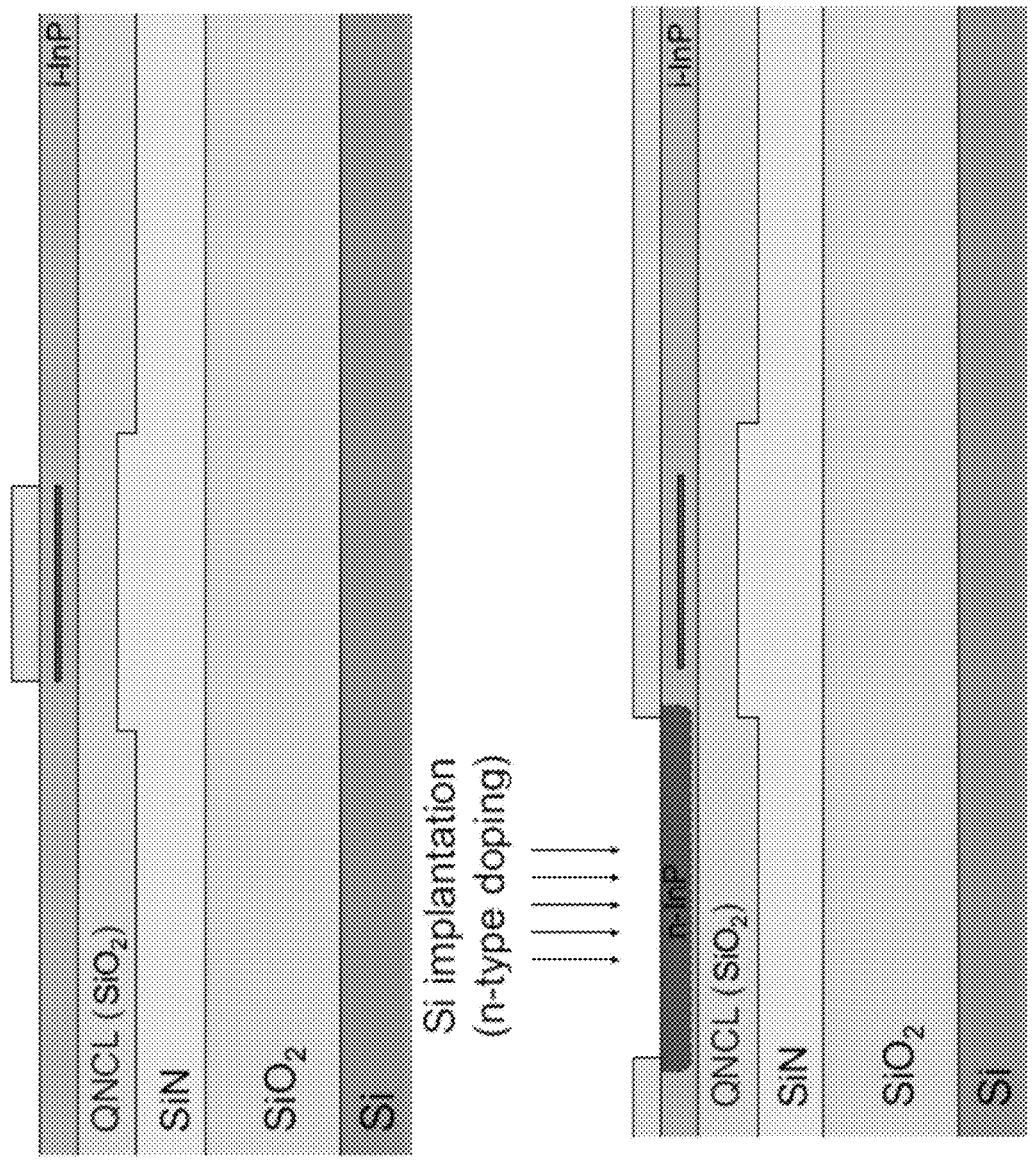
Figure 23:
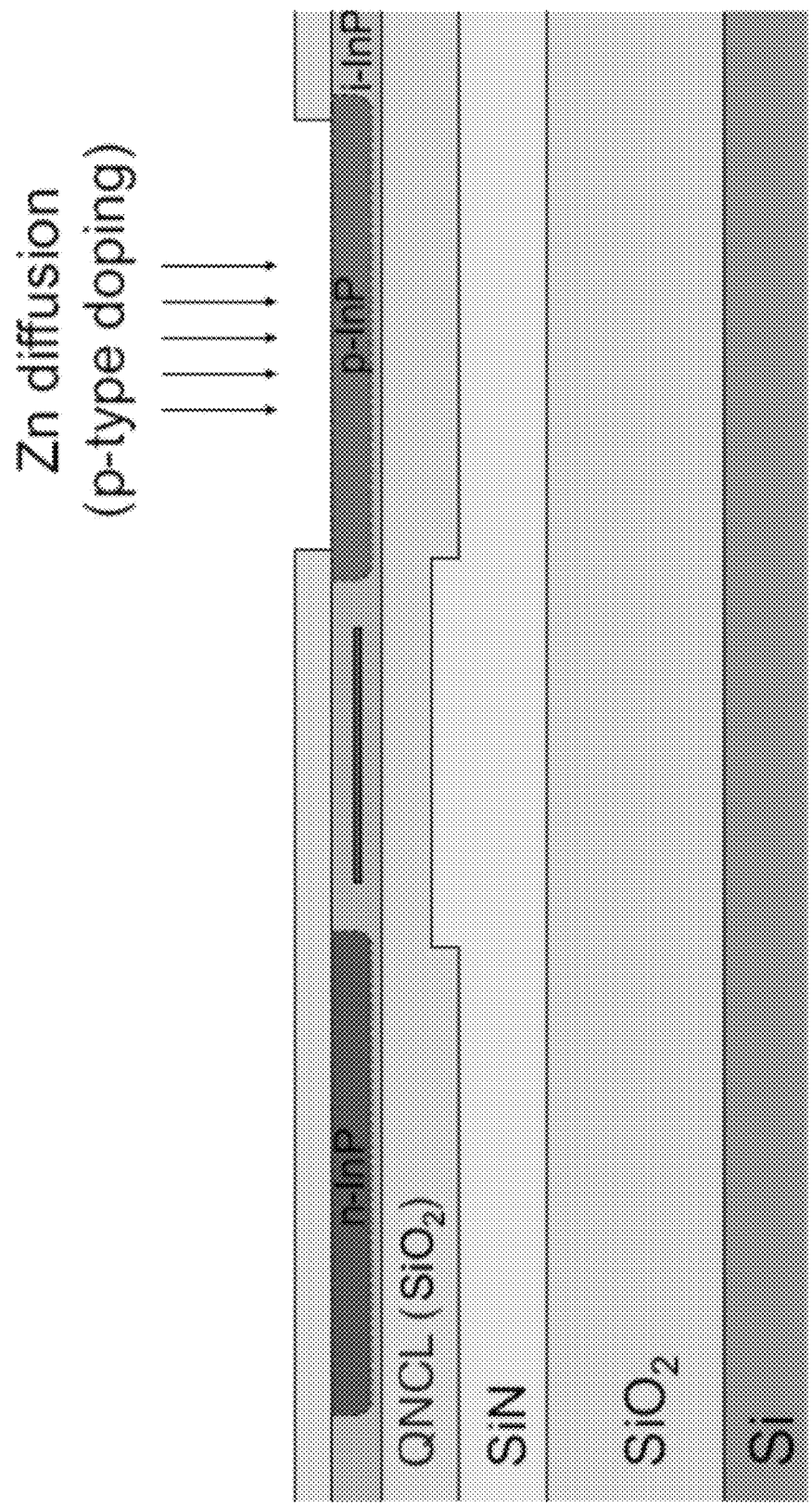
Figure 24:
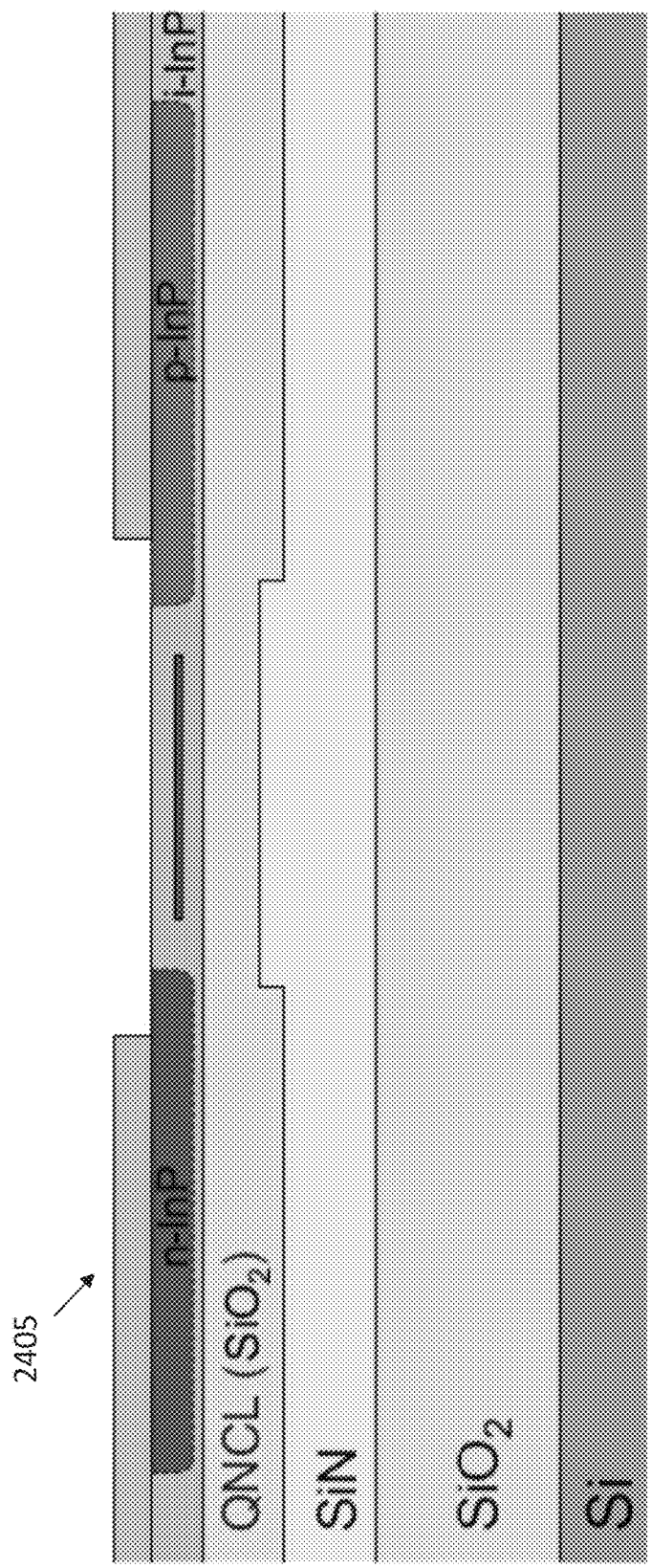

FIGS. 19-24 illustrate an exemplary method of fabrication for one embodiment of the devices of the present disclosure. FIG. 19 illustrates how the process starts with a SiN-on-$SiO_2$-on-Si wafer, followed by patterning of a waveguiding structure (1905) in SiN. FIG. 20 illustrates the deposition (e.g. spin-coating) and precise etchback of a spacer $SiO_2$ layer for planarization and definition of the QNCL, and bonding of the III-V wafer; the InGaAs etch stop (2005) is illustrated. FIG. 21 illustrates the InP substrate removal (i.e. wet etch), and a quantum well (QW) etch to define the lateral extent of the active region. FIG. 22 illustrates epitaxial regrowth of u-InP for lateral barrier formation, and ion implantation for n-type doping (e.g. Si), followed by dopant activation, e.g. by rapid thermal annealing (RTA). FIG. 23 illustrates ion implantation or diffusion for p-type doping (e.g. Zn), followed by dopant activation. FIG. 24 illustrates metal electrode (2405) deposition.

Figure 25:
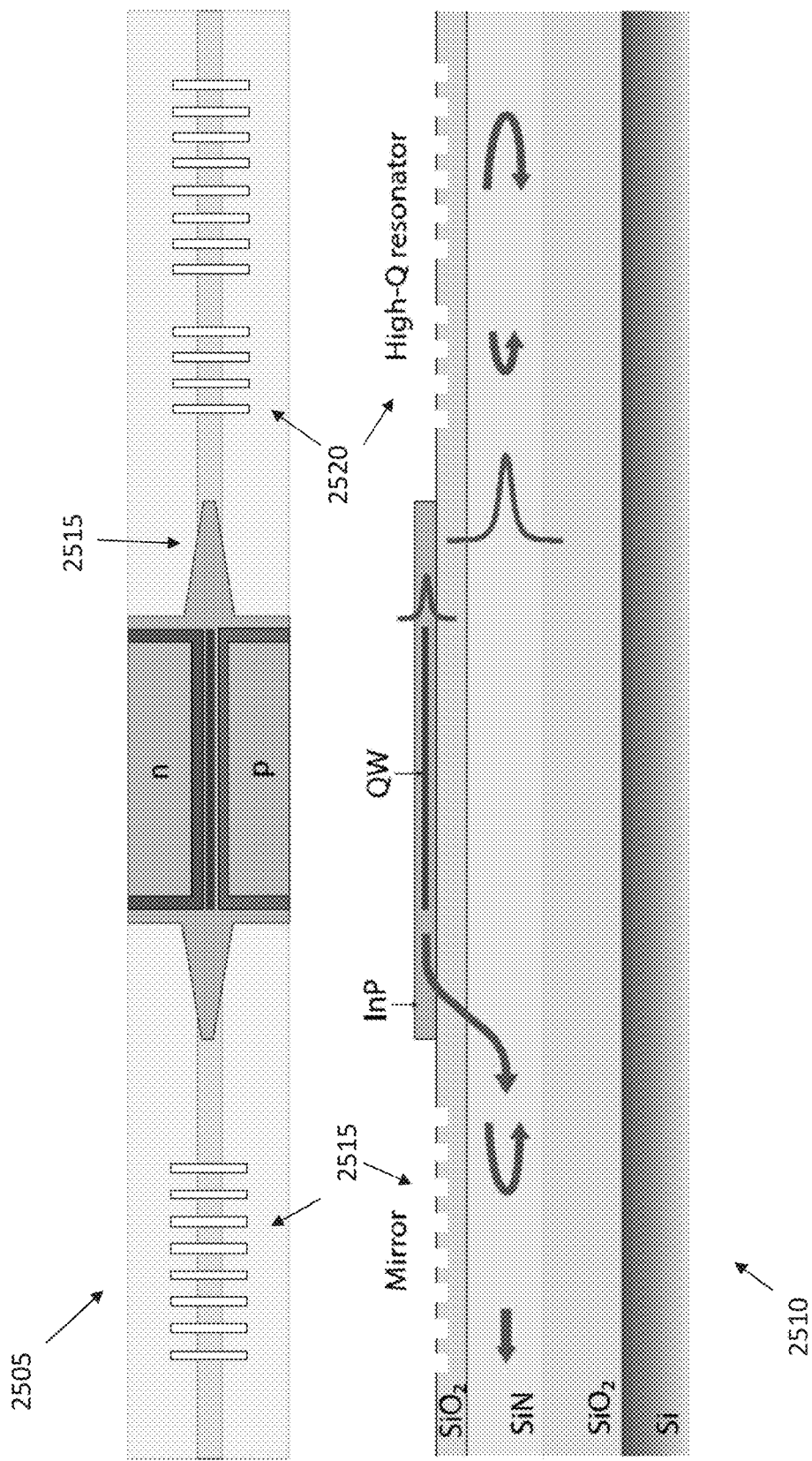
FIG. 25 illustrates an external cavity semiconductor laser based on SiN and a resonant mirror distributed Bragg reflector (DBR).

FIG. 25 illustrates an external cavity semiconductor laser based on SiN and a resonant mirror distributed Bragg reflector (DBR). FIG. 25 illustrates both a top (2505) and side (2510) view, showing a mirror (2515) on one side, and a high Q resonator (2520) on the other side of the active region. The mirrors provide the confinement needed to form the laser; without the mirrors, for example, the same structure could work as an amplifier, with the optical mode moving from the SiN layer on one side of the QW, amplified within the QW, and exiting from the opposite side through SiN. FIG. 25 features an example of mode transformation or conversion between a high index material and a low index material, for the construction of a semiconductor laser. The laser comprises three main sections: two mirror sections on either side of a gain section in the middle. At least one of the mirrors can be optionally implemented by a resonant element (i.e. a high-Q resonator). Light propagates in the upper high index material over the gain section, while it couples into the low index material outside the gain section, via adiabatic mode transformation.

The adiabatic mode converter provides complete, fundamental-to-fundamental mode conversion (III-V to SiN and vice versa), conducive to low reflection and transition loss. As visible in FIG. 25, low-aspect ratio (height/width<1), blunt-tip (>300 nm) tapers (2515) are present on both sides of the active region. These tapered sections can be fabricated with state-of-the-art photo-lithography (e.g. deep UV). These sections can be fabricated in one step by, for example, single lithography and reactive ion etch (ME) steps, due to the homogeneous and thin nature of the taper material (InP), enabled by ultra-thin III-V film integration and subsequent InP regrowth. The ultra-thin III-V semiconductor enables access to III-V effective indices <1.45, allowing coupling to SiN of arbitrarily small thickness, as well as $SiO_2$ waveguides. The tapers have a constant thickness in the vertical direction, perpendicularly to the main plane of the device. The constant thickness enables the gradual, progressive decrease of the effective index of the active region which tapers through a decreasing width. As the effective index thresholds below the index of the low index region underneath, the optical mode transfers onto the lower region. Therefore, even though the refractive index of the active region material is higher, its effective index is controlled and decreased by changing its thickness (to a constant value lower than what is normally used in such structures), and by changing its width (by tapering).

Figure 26:
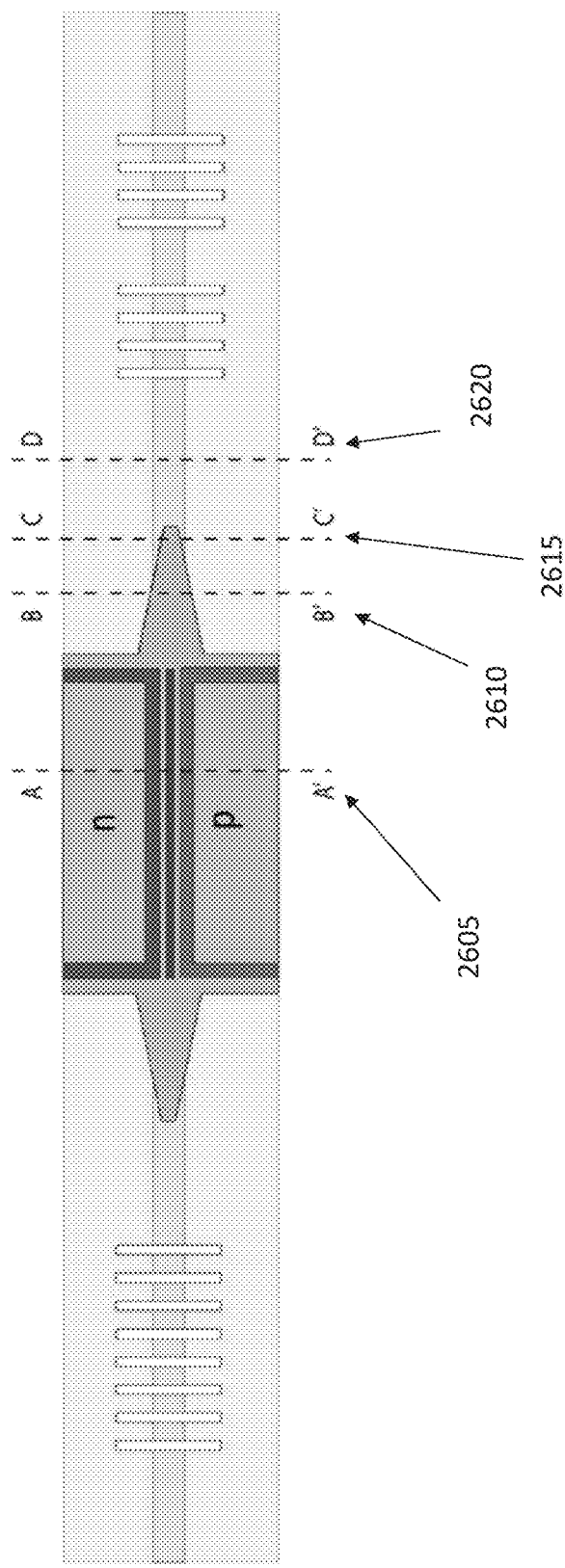
FIGS. 26-31 illustrate the concept of adiabatic mode conversion.
Figure 27:
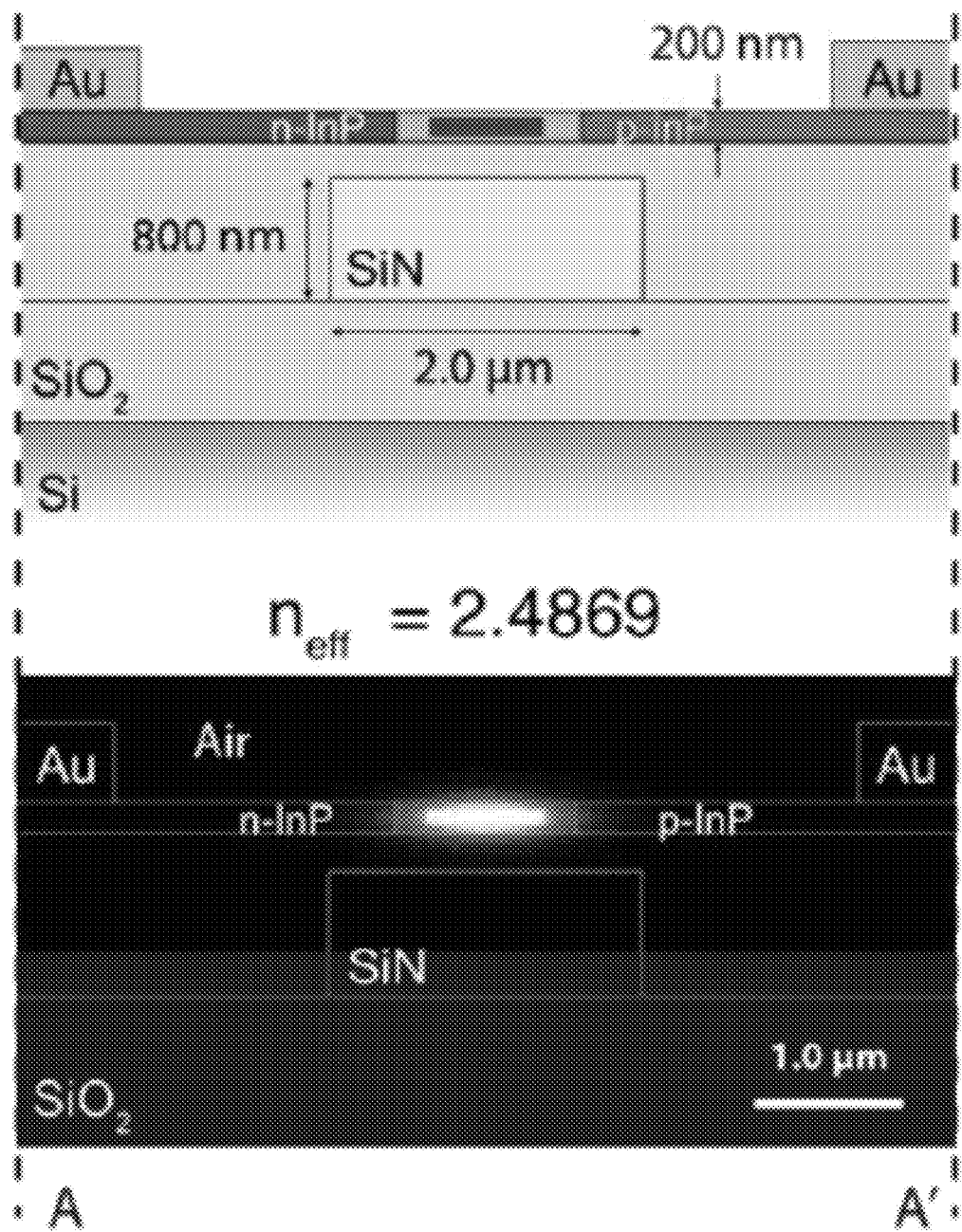
Figure 28:
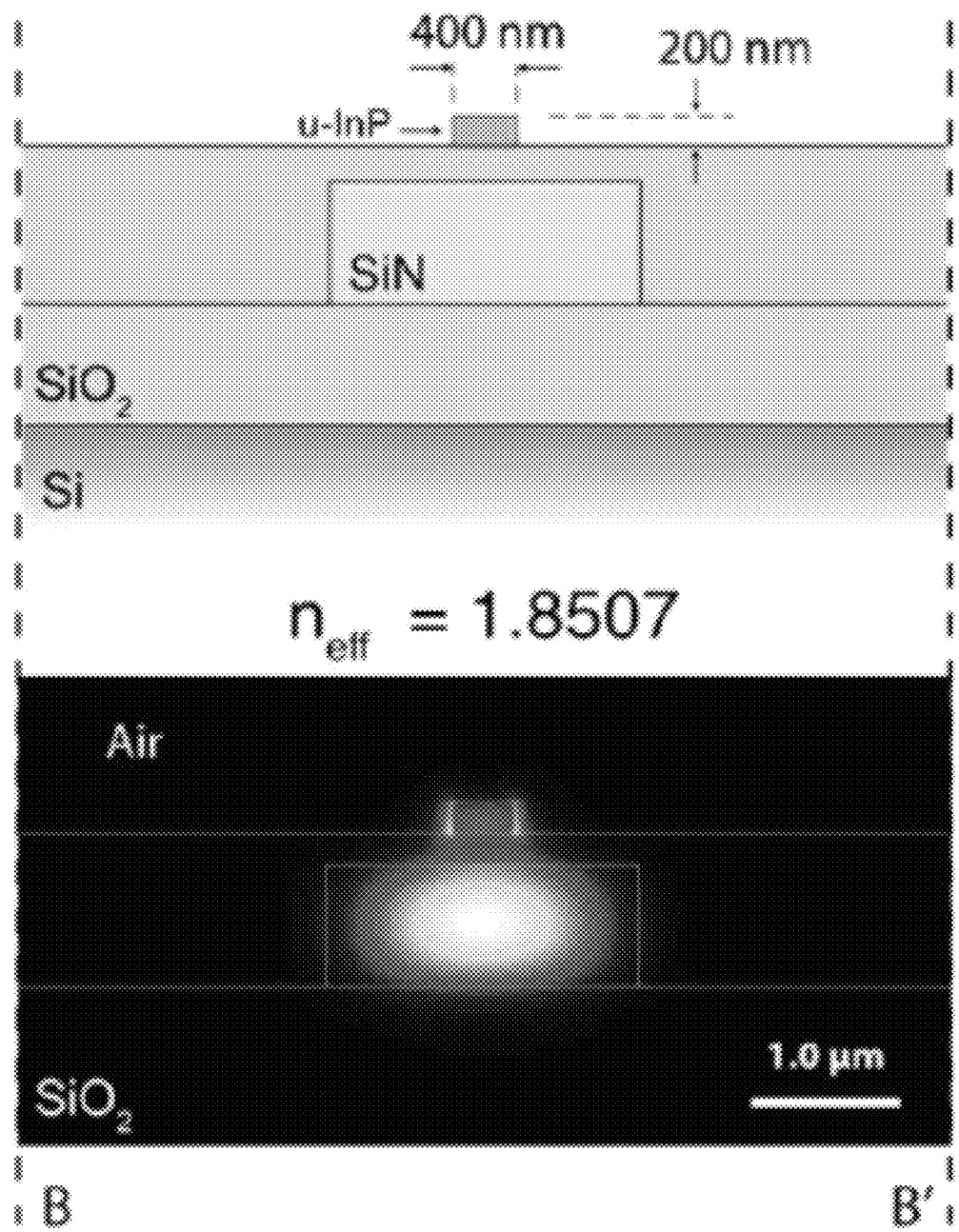
Figure 29:
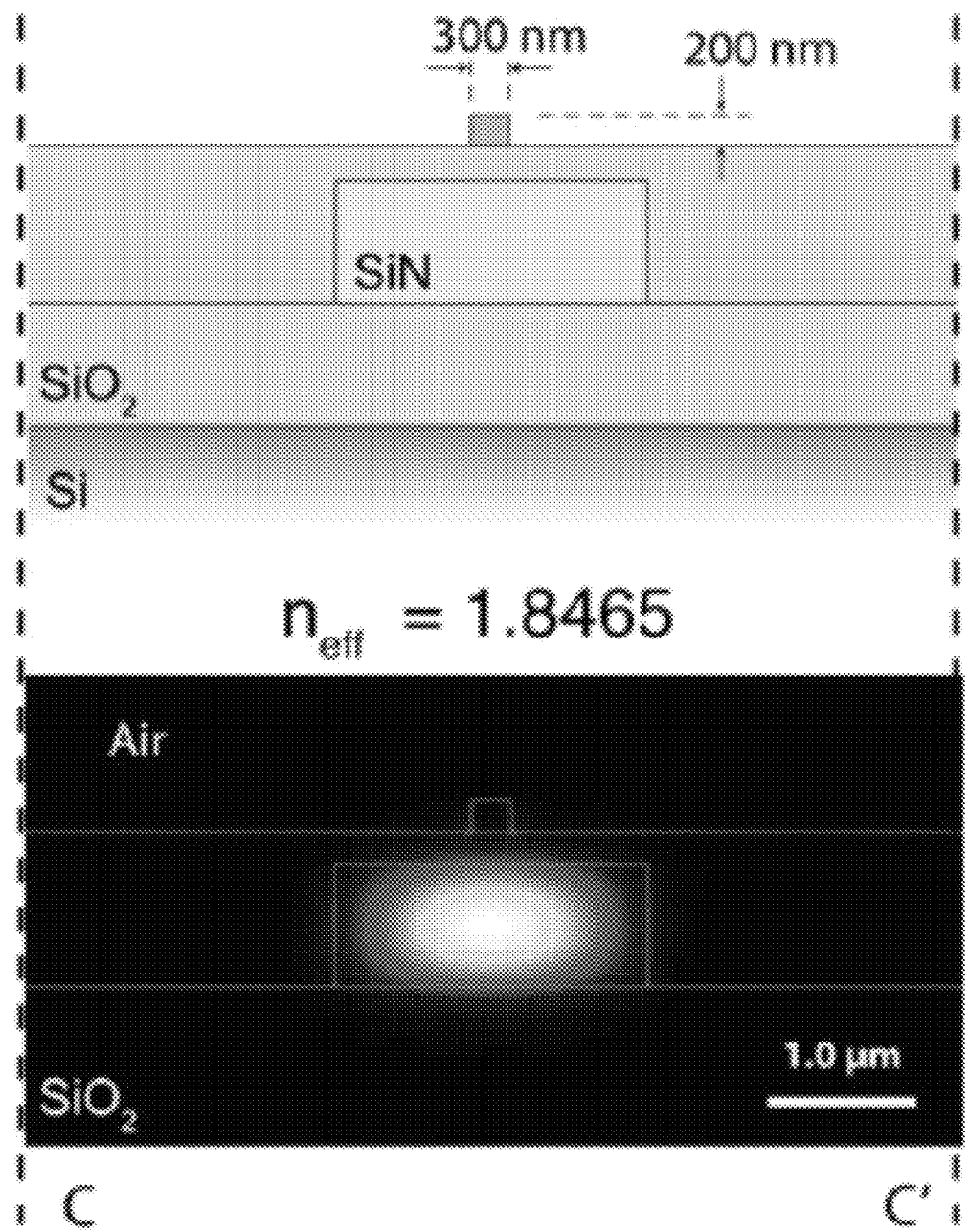
Figure 30:
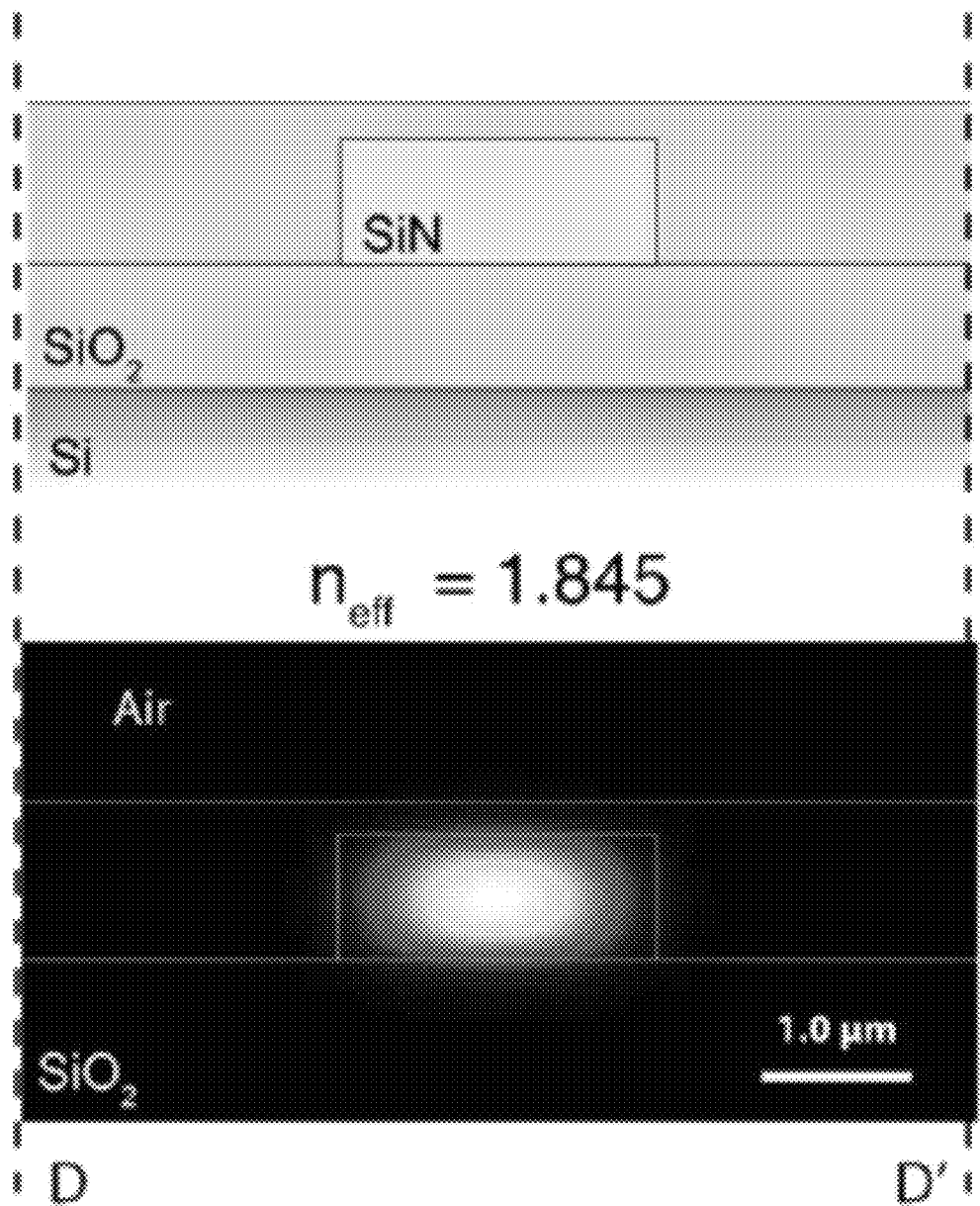

FIGS. 26-30 illustrate the concept of adiabatic mode conversion. FIGS. 27 through 30 (see below) feature simulated optical mode profiles at various cross-sections along the propagation axis (AA', BB', CC', and DD') illustrating the process of mode transformation from a high index guided mode to a low index guided mode. Each mode profile is a rigorous solution of Maxwell's electromagnetic equations across the corresponding 2D cross-section. It can be noted that the process is reversible, i.e. it can also be carried out from the low index material to the high index material. With reference to FIG. 26: FIG. 27 illustrates a cross section across (2605); FIG. 28 illustrates a cross section across (2610); FIG. 29 illustrates a cross section across (2615); and FIG. 30 illustrates a cross section across (2620). In FIGS. 27-30, $n_{eff}$ is the effective index of the mode and is calculated by the solution of Maxwell's equations. In FIG. 27, the cross section is taken in the middle of gain section, and light is predominantly confined in the upper, high index material. In FIG. 28, the cross section is taken at the taper, showing the adiabatic mode transformation. As the lateral width of the taper is reduced, the energy of the mode gradually moves from the high index material to the low index material. This transformation is also reflected in the decrease of $n_{eff}$. In FIG. 29, the cross section is also taken at the taper, but for a smaller taper lateral width compared to FIG. 28. The mode has effectively transformed into one predominantly confined in the low index material. In FIG. 30, the cross section is taken outside the gain section; the light is confined in the low index material.

Figure 13:
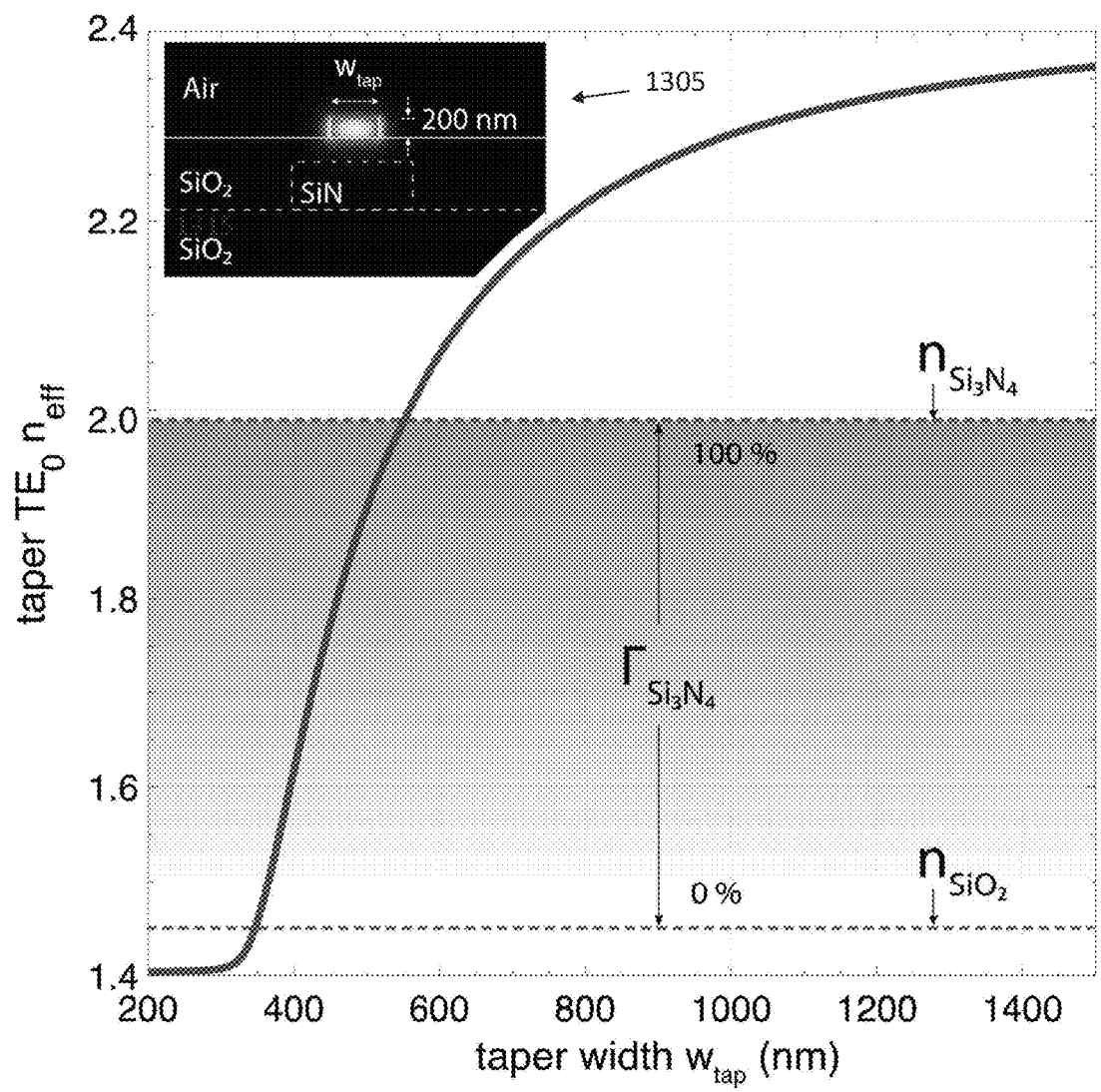
FIG. 13 illustrates the variation of the effective index for the active region, by tapering.
Figure 31:
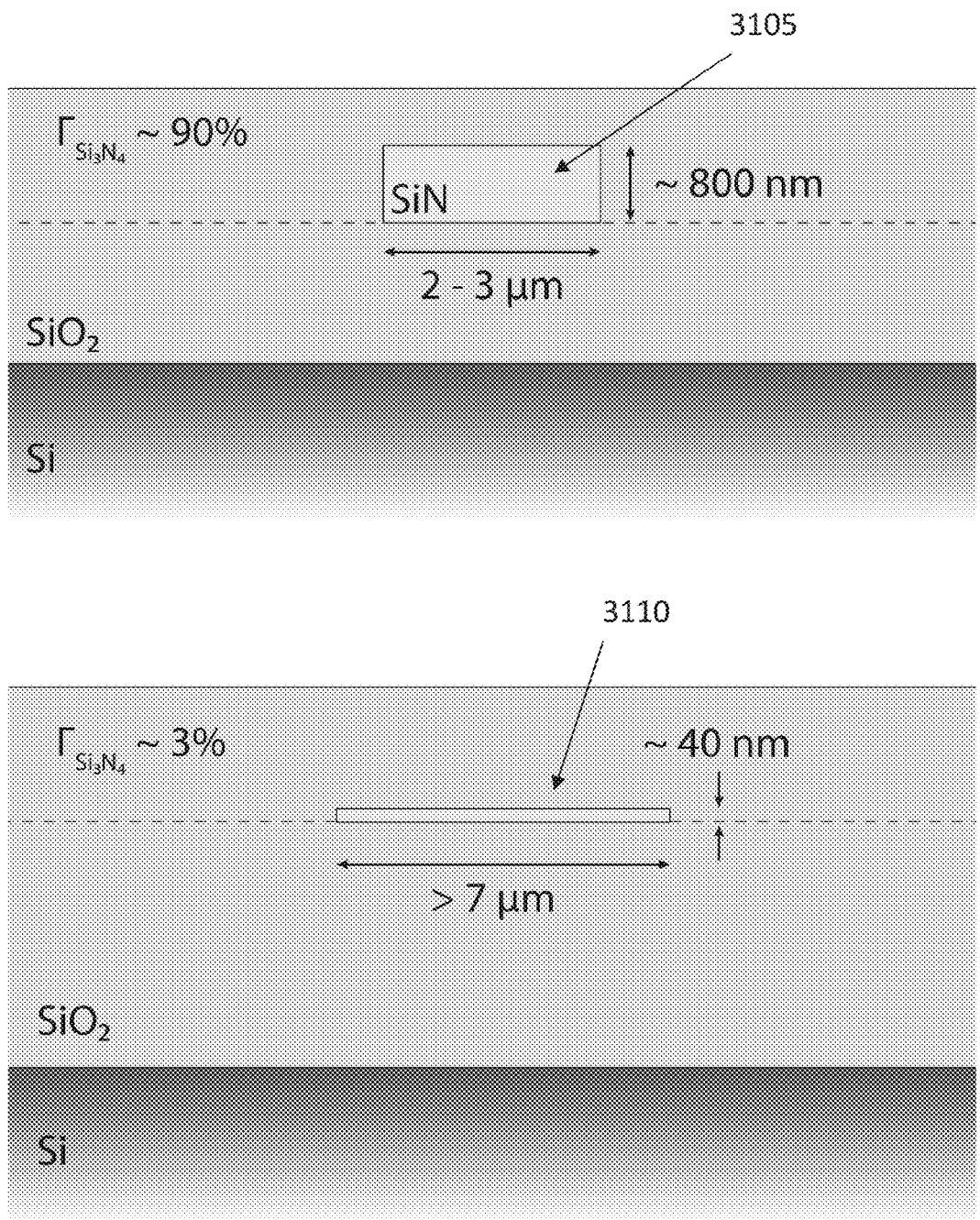

FIGS. 13 and 31 illustrate III-V-to-$Si_3N_4$ mode conversion. A thick SiN layer (3105) gives high SiN confinement, Q between $10^6$ and $10^7$, and $\chi^{(3)}$ nonlinear optics (e.g. frequency combs, supercontinuum). An ultrathin SiN layer (3110) gives low SiN confinement, Q between $10^7$ and $10^8$, and applications similar to those for silicon dioxide (e.g. stimulated Brillouin/Raman scattering, laser stabilization). FIG. 13 is a plot of the calculated effective index ($n_{eff}$) of the fundamental transverse electric mode ($TE_0$) as a function of the lateral width ($w_{tap}$) of the taper (i.e. high-index material) (in this case represented by Indium Phosphide, InP). The inset (1305) features an example of a simulated mode profile corresponding to one of the data points. The thickness of the high-index material is kept constant throughout (e.g. 200 nm). It can be noted that in this particular calculation, the presence of the low-index material is not accounted for. As the taper width is decreased, the effective index decreases as well, from about 2.0 down to 1.40. This range covers indices of modes confined in and guided by a number of low-index materials, including silicon nitride ($Si_3N_4$) and silicon oxide ($SiO_2$). This mode-transformation method can, thus, be used to couple light between high-index materials and a wide host of low-index materials. An important parameter is the thickness of the high-index material. In FIG. 13, $\Gamma_{Si3N4}$ denotes the confinement factor (i.e. fraction of energy) in $Si_3N_4$ for common $Si_3N_4$-based optical waveguides. Two extreme examples of the confinement factor are given in FIG. 31. In FIG. 31, the confinement factor for a 800 nm thick SiN layer is 90%, while the confinement factor for a 40 nm thick SiN layer is 3%. In the example (3110), the optical mode is significantly spread out in the silicon dioxide layer surrounding the thin SiN layer. Therefore, the mode in (3110) is effectively confined within the silicon oxide layer. The confinement factor can be controlled by varying the thickness and aspect ratio of the SiN layer.

In FIG. 13, $n_{Si3N4}$ and $n_{SiO2}$ correspond to the bulk refractive indices of $Si_3N_4$ and $SiO_2$, respectively. It can be noted in FIG. 13 that the effective index of the active region decreases with the taper width. When the effective index drops below that of the low index region, the optical mode is transferred. The mode transfer is gradual due to the gradual width tapering and the constant thickness of the active region. This method can work with a range of low indexes as illustrated in FIG. 13.

Figure 32:
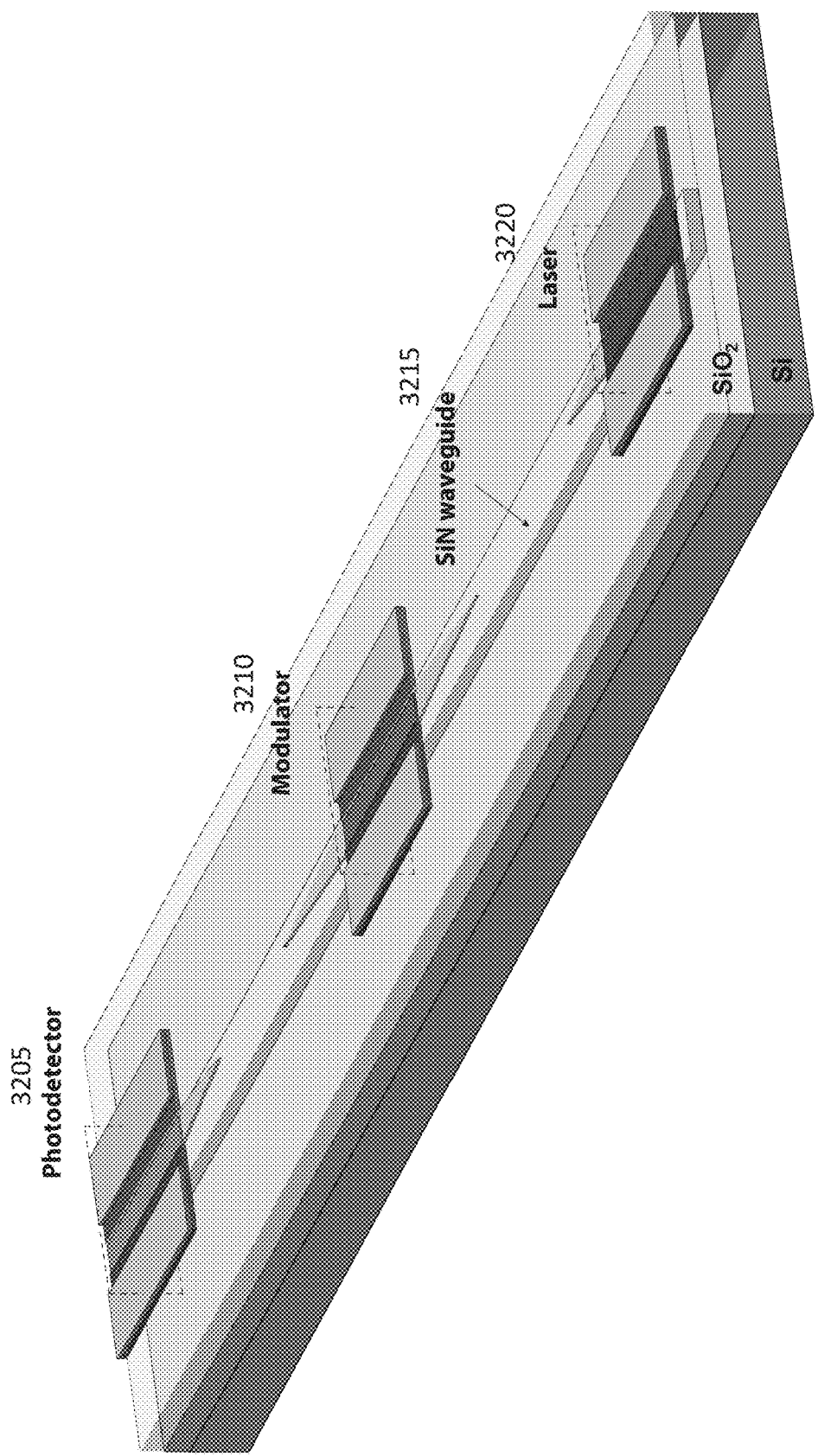
FIGS. 32-35 illustrate an exemplary optical circuit and its optical mode.
Figure 33:
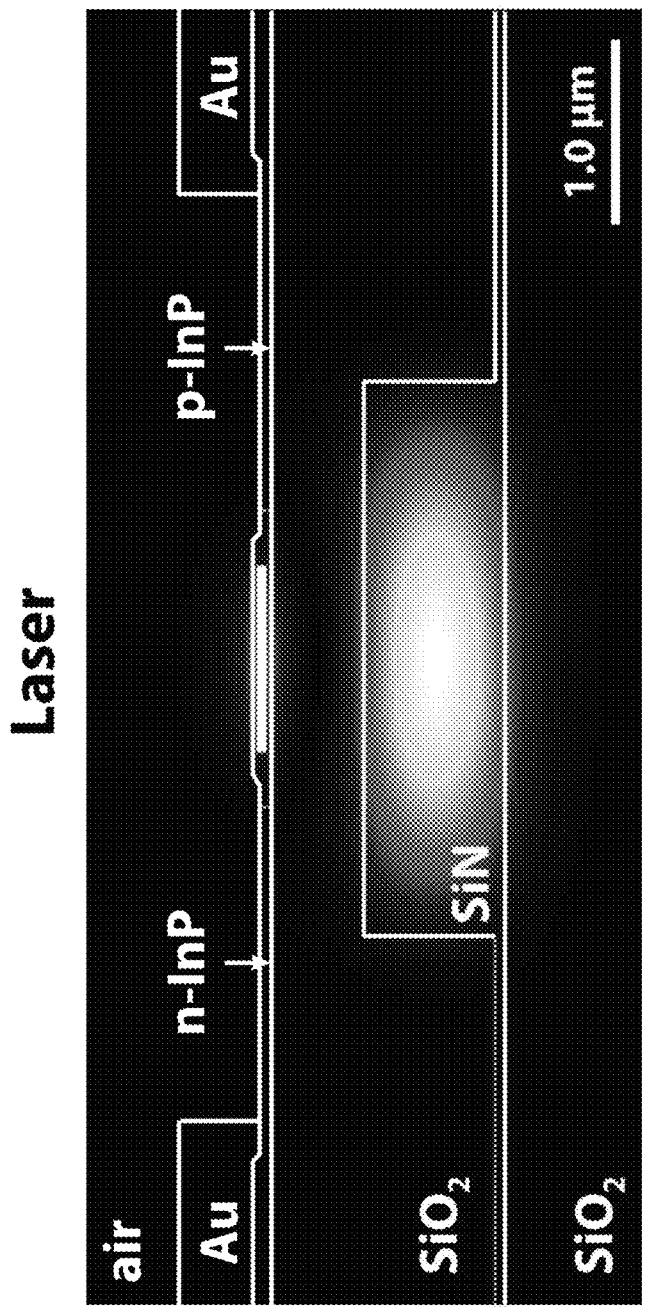
Figure 34:
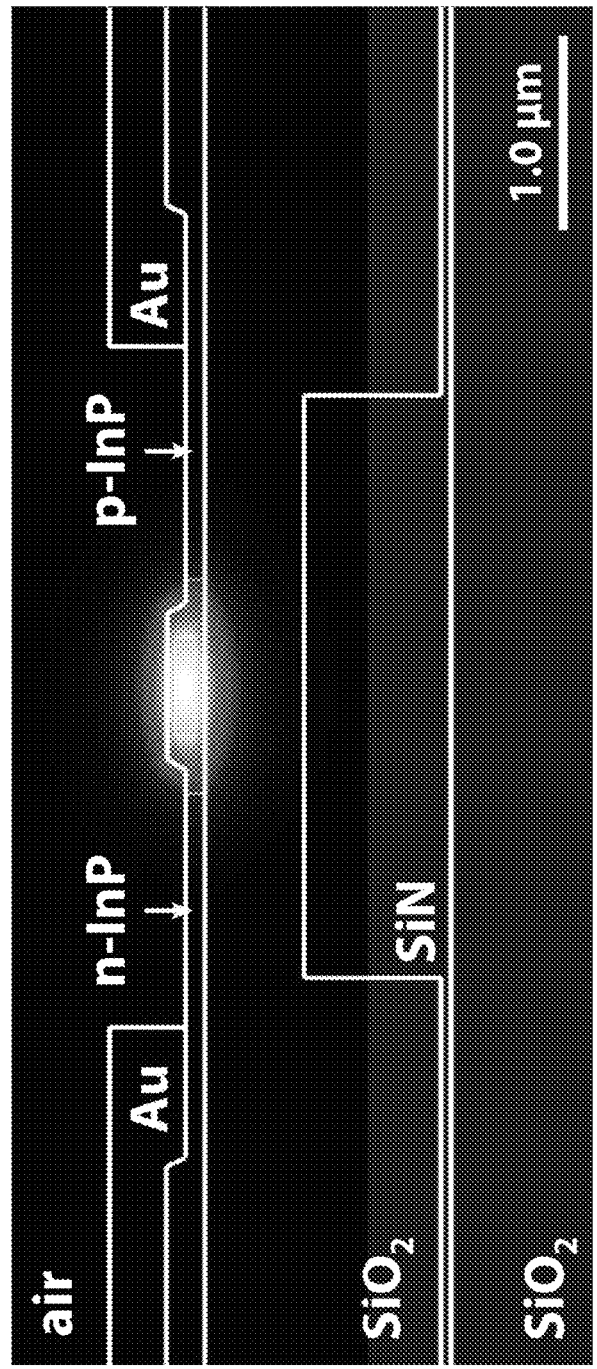
Figure 35:
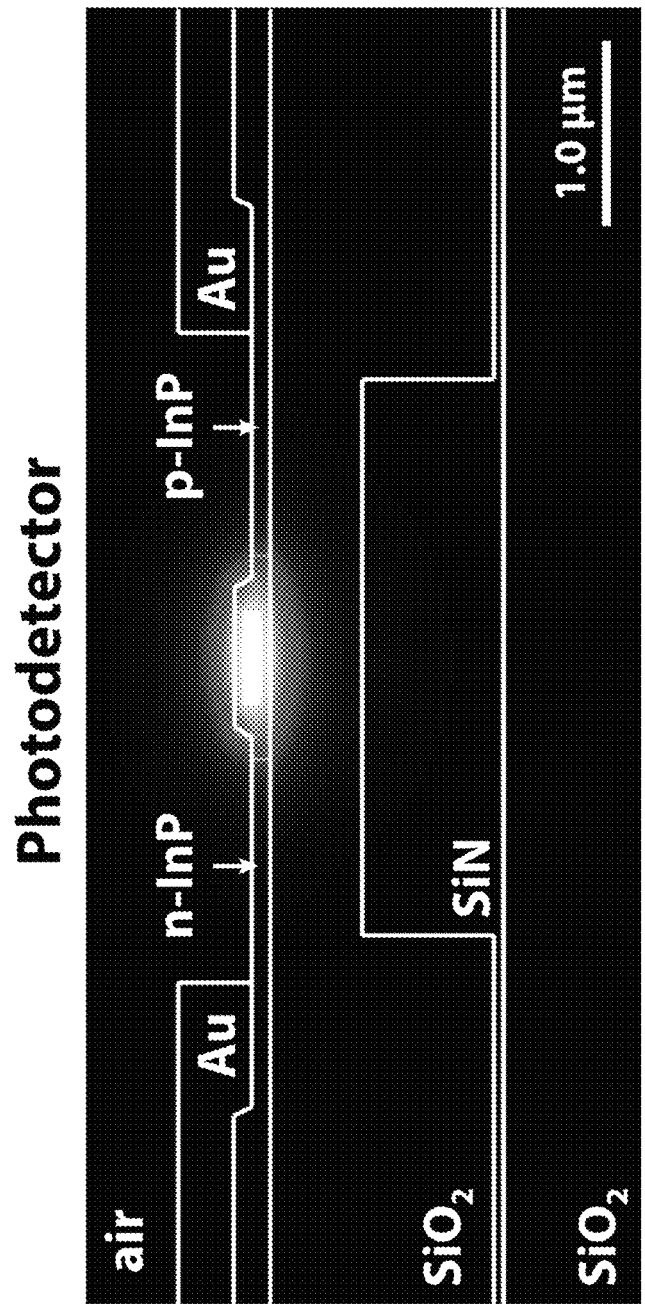

FIGS. 32-35 illustrate an exemplary optical circuit and its optical mode. FIG. 32 illustrates an optical circuit on a low index guiding platform (SiN) based on the direct optical interfacing between the low index and a higher index material. The latter imparts to the platform active optical functionality (e.g. laser emission, optical modulation, light detection), while the former serves as the guiding "backbone". The device comprises a photodetector (3205), a modulator (3210), a SiN waveguide (3215), and a laser (3220); tapers are present in the structure for adiabatic coupling. FIG. 33 illustrates a simulated optical mode profile across the laser cross-section (3220). FIG. 34 illustrates a simulated optical mode profile across the modulator cross-section (3210). FIG. 35 illustrates a simulated optical mode profile across the photodetector cross-section (3205). The relative optical confinement of the optical mode between the upper, high-index material and the lower, low-index material can be controlled via the thickness of the high-index material (in the pictured example, InP).

In some embodiments, the low index material has a refractive index between 1.4 and 3, while the active region has a refractive index of 3 or greater. It should be noted that the active region refractive index refers to the material's intrinsic index, and is different from its effective refractive index that is decreased by changing its width or thickness. In some embodiments, the thickness of the active region is equal to or less than 100 nm; this is valid for example for III-V semiconductors, as well as Si and Ge embodiments. However, when using adiabatic coupling, the thickness of the active region does not need to be less than 100 nm. In some embodiments, the QNCL layer is a dielectric or low index oxide, while in other embodiments it may be absent. In some embodiments, the optical mode during operation of the device is at least 80% confined within the low index material, and therefore has a 20% or less confinement within the active region. In some embodiments, the low index region has a thickness of at least 500 nm. The active region is a semiconductor region which generates photons and can be pumped, for example, electrically or optically.

In some embodiments, pumping of the active region of the devices of the present disclosure is electrical, for example with lateral injection, but in other embodiments pumping can be carried out in a different way, for example by optical pumping. In some embodiments, an adiabatic coupling is a coupling where the optical mode is transferred between the low index and high index regions, with low power lost into unwanted modes. A discussion of adiabatic coupling is presented in Sun et al., Optics Letters vol. 34, 280 (2009), the disclosure of which is incorporated by reference in its entirety. Sun described the shortest adiabatic mode converter as having a length of $2/(\pi\sqrt{\varepsilon})$, where $\varepsilon$ is the fraction of power coupled into the unwanted mode. This condition can be referred to as "adiabaticity criterion" and can be applied to the adiabatic coupling of the present disclosure. Expectedly, the smaller that power, the longer the coupler needs to be. The examples of the present disclosure describe a silicon dioxide layer between the III-V semiconductor and SiN. However, in some embodiments, there is no layer between the high index material and the low index SiN or other material. Coupling of a III-V semiconductor with SiN has been attempted before by Bovington et al., Optics Letters vol. 39, 6017 (2014). However, a key difference in the structure described by Bovington is that the tapers in Bovington have a step-wise variation in thickness, contrary to the constant vertical thickness of the tapers of the present disclosure. The constant thickness of the high index layer in the vertical direction allows a much better coupling between the high index region and the low index region. Only the width of the high index layer is varied, to effectively and gradually reduce the effective refractive index of the active region. The step-wise variation described in Bovington does not allow such gradual variation and presents several disadvantages. In some embodiments, the semiconducting material is a binary, ternary or quaternary III-V semiconductor alloy.

In some embodiments, the high index active region is a semiconductor, for example a III-V semiconductor, or Si. The active region may comprise doping and therefore provide pathways for electrical conduction, or it may comprise a dielectric such as intrinsic Si. In some embodiments, the active region may have a maximum thickness of 150 nm. In some embodiments, the low index region can be referred to as a dielectric region and comprises one or more dielectric materials, such as SiN. The dielectric region, in some embodiments, may have a thickness of at least 400 nm or at least 500 nm. The refractive index of the active region is a function of thickness. Therefore, using a very low thin layer causes the refractive index to be reduced relative to its intrinsic bulk value. This reduction allows coupling of the optical mode away from the active region and into the low index region. In the adiabatic coupling embodiment, in some embodiments a thickness of the active region is 300 nm or less.

In some embodiments, the optical mode is confined during operation at least 80% within the dielectric or low loss region. However, in other embodiments, for example using adiabatic coupling, the optical mode is confined in the dielectric region at least 80% only in some portions of the low loss region. In some embodiments, the active region comprises a photon generation region such as a quantum well or quantum dot. In some embodiments the width of the tapers decreases monotonically. In some embodiments, the optical mode is at least 80% confined within the active region in the central region between the two tapered regions with reference to FIG. 26, it is gradually coupled across the dielectric region, and it is at least 80% confined within the low loss region outside the tapered and central regions. In some embodiments, a thickness of the low loss region and a thickness of the dielectric layer are configured according to a confinement factor for the optical mode within the dielectric region, a higher confinement factor corresponding to the optical mode being predominantly within the dielectric region, and a lower confinement factor corresponding to the optical mode being predominantly within the dielectric layer. In some embodiments, in the tapered regions the confinement of the optical mode is gradually transformed between the two opposite cases of 80% confinement in the high index region and the 80% confinement in the low index region. In some embodiments, the high index region has an effective refractive index that is actually lower than that of the low index region.

In some embodiments, with reference to FIG. 26, the methods of the present disclosure comprise gradually and monotonically reducing a confinement of the optical mode from 80% within the active region to 80% within the dielectric region, over at least a third portion of the device between the at least first portion of the device and the at least second portion of the device. The examples set forth above are provided to those of ordinary skill in the art as a complete disclosure and description of how to make and use the embodiments of the disclosure, and are not intended to limit the scope of what the inventor/inventors regard as their disclosure. In some embodiments, the high index region is termed the first region, and the low index region is termed the second region. The person of ordinary skill in the art will understand that in the present disclosure the two regions and materials have been referred to as a high index region or material, and a low index region or material. This description refers to the bulk refractive indexes. For example, if the device comprises a III-V semiconductor as the high index material, and SiN as the low index material, the bulk refractive index of the III-V semiconductor is higher than the bulk refractive index of SiN. The methods and devices of the present disclosure function based on controlling the effective refractive index of the high index material, lowering it through control of its thickness and/or width, in order to bring it to the same value, or a lower value, compared to the low index material.

Therefore, the effective index of the III-V semiconductor, for example, is lowered to a value below the bulk index of the III-V semiconductor, and also lowered to a value equal to, or below, that of the bulk low index material. The effective index can be reduced from the bulk value by decreasing the thickness of the high index material, since the index is a function of thickness. The index can also be reduced by tapering the width of the high index material, as shown in the embodiment with adiabatic coupling. The adiabatic devices may have one or two tapers. In some embodiments, the high index material may be a binary or ternary (or higher) compound; in these embodiments the person of ordinary skill in the art will understand that the contrast is between the bulk effective index arising from having, for example, a binary compound, and the effective index arising from reducing the thickness or width. Similarly, the high index material may in fact be a multilayer, and therefore in these cases the contrast would be between the effective index arising from layering, compared to the reduced effective index arising from controlling the thickness or width. In some embodiments the high index region comprises photon generation or emission, while in other embodiments the optical mode is transmitted through the region without photon generation. In some embodiments, the first bulk refractive index is greater than 3, and the second bulk refractive index is between 1.4 and 3. Therefore, the effective refractive index can be reduced from the bulk value of 3 or more to between 1.4 and 3. In the adiabatic coupling embodiment, the effective refractive index gradually changes over the taper region, while in the evanescent coupling embodiment the effective refractive index is constant since the thickness and width are constant. In some embodiments, the optical mode can be confined preponderantly within the high index region or the low index region, for example at least 50% or more than 50% within one region.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

What is claimed is:

1. A device comprising:
a first region having a first bulk refractive index, the first region made of a semiconducting material;
a second region having a second bulk refractive index, the second region made of a dielectric material and configured to confine an optical mode during operation of the device; and
a quantum noise control layer between the first region and the second region, the quantum noise control layer having a third bulk refractive index;
wherein:
during operation, the optical mode is at least 80% confined within the second region,
the first bulk refractive index is higher than the second bulk refractive index,
a first effective refractive index of the first region for the optical mode is lower than the first bulk refractive index,
the first effective refractive index is equal to or lower than a second effective refractive index of the second region for the optical mode,
the quantum noise control layer is made of a dielectric material,
the quantum noise control layer is configured to confine the optical mode within the second region, and
the third bulk refractive index is between 1.4 and 3.

2. The device of claim 1, wherein the semiconducting material is a binary, ternary or quaternary III-V semiconductor alloy.

3. The device of claim 2, wherein the second region is SiN and a thickness of the first region is equal to or less than 100 nm.

4. The device of claim 3, wherein a thickness of the second region is equal to or greater than 400 nm.

5. The device of claim 1, wherein the semiconducting material is selected from the group consisting of: GaN, GaP, GaAs, InAs, InP, Si, and Ge.

6. The device of claim 1, wherein a thickness of the first region is equal to or less than 150 nm.

7. The device of claim 1, wherein the first bulk refractive index is greater than 3, and the second bulk refractive index is between 1.4 and 3.

8. The device of claim 1, wherein the quantum noise control layer is made of silicon dioxide.

9. The device of claim 1, wherein the first region comprises a photon generation region, an intrinsic region, an n-doped region, and a p-doped region, the n-doped region and the p-doped region configured to inject charge carriers laterally into the photon generation region.

10. The device of claim 9, wherein the photon generation region comprises a quantum well.

11. A device comprising:
a first region made of a semiconducting material and having a first bulk refractive index; and
a second region, having a second bulk refractive index, made of a dielectric material and configured to confine an optical mode during operation of the device,
wherein:
a thickness of the first region is constant,
the first region comprises a central region having a constant width, and at least one tapered region on a side of the central region,
the at least one tapered region has a monotonically decreasing width,
during operation:
in the central region of the first region, the optical mode is at least 80% confined within the first region,
in the at least one tapered region, the optical mode is adiabatically and gradually coupled from the first region into the second region, and
outside the central region and outside the at least one tapered region, the optical mode is confined at least 80% within the second region,
the first bulk refractive index is higher than the second bulk refractive index, and
an effective refractive index for the optical mode of the at least one tapered region of the first region monotonically decreases with the monotonically decreasing width of the at least one tapered region.

12. The device of claim 11, wherein the effective refractive index of the at least one tapered region of the first region monotonically decreases to a value equal to or below the second bulk refractive index.

13. The device of claim 11, wherein the semiconducting material is a binary, ternary or quaternary III-V semiconductor alloy.

14. The device of claim 11, wherein the semiconducting material is selected from the group consisting of: GaN, GaP, GaAs, InAs, InP, Si, and Ge.

15. The device of claim 11, wherein the first bulk refractive index is greater than 3, and the second bulk refractive index is between 1.4 and 3.

16. The device of claim 11, wherein a thickness of the first region is 300 nm or less.

17. The device of claim 11, further comprising a dielectric layer between the first region and the second region, the quantum noise control layer having a third bulk refractive index, wherein:
the quantum noise control layer is made of a dielectric material,
the third bulk refractive index is between 1.4 and 3, and
a thickness of the second region and a thickness of the dielectric layer are configured based on a confinement factor for the optical mode within the second region, a higher confinement factor corresponding to the optical mode being predominantly within the second region, and a lower confinement factor corresponding to the optical mode being predominantly within the dielectric layer.

18. The device of claim 17, wherein the dielectric layer is made of silicon dioxide.

19. The device of claim 11, wherein the first region comprises a photon generation region, an intrinsic region, an n-doped region, and a p-doped region, the n-doped region and the p-doped region configured to inject charge carriers laterally into the photon generation region.

20. The device of claim 19, wherein the photon generation region comprises a quantum well.

21. A method comprising:
providing a device comprising:
a first region having a first bulk refractive index, the first region made of a semiconducting material;
a second region having a second bulk refractive index, the second region made of a dielectric material and configured to confine an optical mode during operation of the device; and
a quantum noise control layer between the first region and the second region, the quantum noise control layer having a third bulk refractive index, wherein:
the first bulk refractive index is higher than the second bulk refractive index,
a first effective refractive index of the first region for the optical mode is lower than the first bulk refractive index,
the first effective refractive index is equal to or lower than a second effective refractive index of the second region for the optical mode,
confining at least 80% of the optical mode within the second region,
the quantum noise control layer is made of a dielectric material,
the quantum noise control layer is configured to confine the optical mode within the second region, and
the third bulk refractive index is between 1.4 and 3.

22. The method of claim 21, further comprising generating photons in the first region.

23. The method of claim 22, wherein generating photons is by lateral electrical injection or by optical pumping.

24. The method of claim 21, wherein a thickness of the active region is 150 nm or less.

25. A method comprising:
providing a device comprising:
a first region having a first bulk refractive index, the first region made of a semiconducting material; and
a second region having a second bulk refractive index, the second region made of a dielectric material and configured to confine an optical mode during operation of the device, wherein:
the first bulk refractive index is higher than the second bulk refractive index,
a thickness of the active region is constant;
the first region comprises a central region having a constant width, and at least one tapered region on a side of the central region,
the at least one tapered region has a monotonically decreasing width,
during operation:
in the central region of the first region, the optical mode is at least 80% confined within the first region, in the at least one tapered region, the optical mode is adiabatically and gradually coupled from the first region into the second region, and outside the central region and outside the at least one tapered region, the optical mode is confined at least 80% within the second region, the first bulk refractive index is higher than the second bulk refractive index, and an effective refractive index for the optical mode of the at least one tapered region of the first region monotonically decreases with the monotonically decreasing width of the at least one tapered region.

26. The method of claim 25, further comprising gradually and monotonically reducing a confinement of the optical mode from 80% within the first region to 80% within the second region, over at least a third zone of the device between the at least first zone of the device and the at least second zone of the device.

\* \* \* \* \*